(12) United States Patent
Tsuji et al.

(10) Patent No.: US 6,922,910 B2
(45) Date of Patent: Aug. 2, 2005

(54) EXPOSURE APPARATUS

(75) Inventors: Toshihiko Tsuji, Saitama (JP);
Yoshitomo Nagahashi, Takasaki (JP);
Takaaki Kimura, Konosu (JP);
Shinichi Takagi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 41 days.

(21) Appl. No.: 10/606,033

(22) Filed: Jun. 26, 2003

(65) Prior Publication Data

US 2004/0055177 A1 Mar. 25, 2004

Related U.S. Application Data

(63) Continuation of application No. PCT/JP01/11634, filed on Dec. 28, 2001.

(30) Foreign Application Priority Data

Dec. 28, 2000 (JP) ........................................ 2000-402273

(51) Int. Cl.[7] .............................................. F26B 19/00
(52) U.S. Cl. .............................. 34/210; 34/212; 34/215
(58) Field of Search .......................... 34/209, 210, 212, 34/218, 219, 215, 60, 62; 355/30, 53, 67

(56) References Cited

U.S. PATENT DOCUMENTS 4,786,947 A    11/1988   Kosugi et al.
6,297,871 B1  * 10/2001  Hagiwara .................... 355/30
2003/0038929 A1  2/2003  Tokuda et al.

FOREIGN PATENT DOCUMENTS

| DE | 199 32 735 A1 | 10/2000 |
|----|---------------|---------|
| JP | A 62-69617    | 3/1987  |
| JP | A 62-181426   | 8/1987  |
| JP | A 2-77809     | 3/1990  |
| JP | A 2000-299265 | 10/2000 |
| JP | A 2001-44112  | 2/2001  |
| JP | A 2001-345248 | 12/2001 |
| KR | 2000-0065440  | 11/2000 |

* cited by examiner

*Primary Examiner*—Jiping Lu
(74) *Attorney, Agent, or Firm*—Oliff & Berridge, PLC

(57) ABSTRACT

An exposure apparatus is provided for performing exposure processes with high accuracy by accurately performing pressure control inside a chamber having a plurality of air-conditioning chambers. The inside of the main chamber which accommodates the exposure apparatus is divided into a plurality of air-conditioning chambers, and a pressure detection device which detects the pressure is provided with each of the plurality of air-conditioning chambers. Also, among the plurality of the air-conditioning chambers, the pressure inside a main column which accommodates an exposure stage on which a wafer in mounted and subjected to an exposure process, is set to be higher than the pressure of the other air-conditioning chambers based on detection results obtained from the pressure detection devices.

22 Claims, 7 Drawing Sheets

US 6,922,910 B2

EXPOSURE APPARATUS

This is a Continuation of Application No. PCT/JP01/11634 filed Dec. 28, 2001, which claims the benefit of Japanese Patent Application No. 2000-402273 filed Dec. 28, 2000. The entire disclosure of the prior applications is hereby incorporated by reference herein in its entirety.

TECHNICAL FIELD

The present invention relates to an exposure apparatus used for exposing a pattern image onto a substrate.

This application is based on Japanese Patent Application No. 2000-402273, the content of which is incorporated herein by reference.

BACKGROUND ART

Various exposure apparatuses have been employed when semiconductor elements, thin film magnetic heads, or liquid crystal display elements are manufactured using photolithographic processes, however, in general, an apparatus is used which projects a pattern image formed on a photomask or reticle (hereinafter referred to as a "reticle") onto a substrate such as a wafer or a glass plate (hereinafter referred to as a "wafer"), the surface of which has applied thereon a sensitizer such as a photoresist, via a projection optical system. In such an exposure apparatus, a highly accurate temperature control is required in order to carry out exposure processes for minute patterns, and a high level of cleanliness must be maintained by decreasing contaminants in the apparatus. For these reasons, an exposure apparatus is placed in a chamber and the temperature in the chamber is controlled by using an air-conditioning system. Also, the cleanliness of the chamber is maintained by providing a filter for removing contaminants at a part of the flow path of the air-conditioning system.

The chamber used for accommodating the exposure apparatus is divided into a plurality of air-conditioning chambers including an exposure chamber in which the body of the exposure apparatus is accommodated, a reticle loader chamber in which a reticle loader system for loading and unloading a reticle relative to the body of the exposure apparatus is accommodated, and a wafer loader chamber in which a wafer loader system for loading and unloading a wafer relative to the body of the exposure apparatus is accommodated. In addition, the exposure chamber is made of an air-conditioning chamber in which a part thereof, i.e., a main column for accommodating a wafer stage is separated. Also, the air-conditioning system includes an overall air-conditioning system for carrying out an overall air-conditioning for the exposure chamber, and a local air-conditioning system for carrying out a local air-conditioning for each of the main column, the reticle-loader chamber, and the wafer loader chamber.

Here, in the local air-conditioning system for the main column and the wafer loader chamber, the air-conditioning is carried out using a chemical filter which removes substances that enhance resist deterioration, such as ammonia, in order to protect the resist applied to the wafer. In the overall air-conditioning system for the exposure chamber, on the other hand, labor for maintenance and running cost will increase if a chemical filter is used since a large amount of air is required for the overall air-conditioning system and hence the chemical filter is quickly contaminated and needs to be frequently replaced. Accordingly, the air-conditioning is carried out without using a chemical filter in the overall air-conditioning system. Thus, if a gas flows into the main column or the wafer loader chamber in which the air-conditioning is performed using a chemical filter, from the exposure chamber in which the air-conditioning is carried out without using a chemical filter, problems such as increase in resist deterioration of the wafer may be caused.

Also, if contaminants are present in an optical path space, which is a space through which the exposure light passes, problems may be caused in that an exposure process cannot be performed with high accuracy due to factors such as the exposure light being attenuated and cannot reach the wafer with a sufficient strength, or unevenness of illuminance occurs on the wafer.

Conventionally, attempts have been made to prevent the flow of gas that is present outside the chamber into the inside of the chamber by increasing the pressure inside the chamber that accommodates the entire exposure apparatus to be positive all the time with respect to the pressure outside the chamber. However, since the difference in pressure between each of the air-conditioning chambers inside the chamber is very small, a large difference in pressure may be caused and a gas flow (air current) may be generated among each of the air-conditioning chambers and an appropriate air-conditioning cannot be performed unless the pressures are accurately controlled. In the above case, if a flow is generated in the main column, for example, a large change (fluctuation) in the gas refractive index is locally caused. Accordingly, problems may be generated so that it is not possible to achieve an exposure process with high accuracy and so that the accuracy in measurement of optical measuring devices (a laser interferometer, etc.) is reduced. Also, it becomes evident that an accurate pressure control is essential for each exposure apparatus because the differences in pressures are very small as mentioned above and influence due to the differences among the exposure apparatus (i.e., minute errors, etc., generated during the production of the main body of the exposure apparatus, chambers, and so forth).

As explained above, although there is a danger that the resist of the wafers may be deteriorated, the cleanliness of the optical path space for the exposure light cannot be maintained to a predetermined level, and a flow is caused among the air-conditioning chambers and a stable exposure process cannot be achieved, unless the pressure is accurately controlled inside the chamber having a plurality of air-conditioning chambers, a strict pressure control is not conventionally carried out.

DISCLOSURE OF INVENTION

The present invention is achieved in consideration of the above situation, and its purpose includes to provide an exposure apparatus capable of performing a stable exposure process with high accuracy by accurately controlling the pressure inside a chamber having a plurality of air-conditioning chambers.

In order to solve the above-mentioned problems, the present invention has adopted the following configurations, each of which corresponds to FIGS. 1 to 6, respectively, explained in the embodiments of the present invention.

The exposure apparatus (10) of the present invention includes a main body (22) of the exposure apparatus which exposes a pattern onto a substrate (W), the exposure apparatus being accommodated in a chamber (12). The exposure apparatus includes a plurality of air-conditioning chambers (16, 18, 20, and 34) which are formed by dividing the chamber (12); and a pressure detection device (16a, 18a, 20a, and 34a) which detects pressure information (for example, at least one of the pressure of each of the plurality of air-conditioning chambers and the differences of the pressure among the chambers) relating to the plurality of air-conditioning chambers (16, 18, 20, and 34). Here, the pressure detection device may detect, as the pressure information, the pressure of each of the air-conditioning chambers, the differences in the pressure among the air-conditioning chambers, or the differences in pressure with respect to a reference pressure. Also, as the pressure detection device, a pressure sensor may be provided with each of the plurality of the air-conditioning chambers, for example, or it is possible to provide a pressure sampling port with each of the air-conditioning chambers and detect the pressure in each of the air-conditioning chambers while switching piping from the sampling port using electromagnetic valves, etc. As for the latter, in particular, the difference in pressure with respect to a reference pressure (for example, the atmospheric pressure in the clean room in which the exposure apparatus is allocated) may be detected in each of the air-conditioning chambers using a pressure sensor thereof as a differential pressure sensor.

According to the present invention, it is possible to allocate the pressure detection device (16a, 18a, 20a, and 34a) which detects pressure information (for example, the pressure of each of the air-conditioning chambers or the difference in pressure of each of the air-conditioning chambers with respect to a reference pressure) relating to the plurality of air-conditioning chambers (16, 18, 20, and 34), and to accurately control the pressure based on the detection results. Since the cleanliness for the substrate (W) or the space for optical passage of an exposure light may be maintained to be high by accurately carrying out the pressure control, it becomes possible to prevent deterioration of resist when the resist is applied on the wafer (W) or the attenuation in the amount of exposure light in the optical path space. Accordingly, an accurate exposure process can be performed.

The exposure apparatus (10) of the present invention includes a main body of the exposure apparatus which exposes a pattern onto a substrate (W), the exposure apparatus being accommodated in a chamber (12). The exposure apparatus includes a plurality of air-conditioning chambers (16, 18, 20, and 34) which are formed by dividing the chamber (12); and a pressure controlling device (66a, 19a, 21a, and 70) which adjusts pressure in each of the air-conditioning chambers (16, 18, 20, and 34), wherein the plurality of air-conditioning chambers (16, 18, 20, and 34) include a column chamber (34) which accommodates an exposure stage (WST) on which the substrate (W) is mounted and subjected to an exposure process; an exposure chamber (16) which accommodates the main body (22) of the exposure apparatus; a mask transfer system accommodating chamber (18) in which a mask transfer system (80, 82) is accommodated, the mask transfer system transferring a mask (R) on which the pattern is formed into the main body (22) of the exposure apparatus, and transferring the mask (R) from the main body (22) of the exposure apparatus; and a substrate transfer system accommodating chamber (20) in which a substrate transfer system (84, 86, and 88) is accommodated, the substrate transfer system transferring the substrate (W) into the main body (22) of the exposure apparatus, and transferring the substrate (W) from the main body (22) of the exposure apparatus; wherein the pressure controlling device (66a, 19a, 21a, 50a, and 70) performs the adjustment so as to satisfy:

$$P_C \geq P_{WL} \geq P_B \geq P_{RL}$$

where $P_C$ is a pressure of the column chamber (34), $P_B$ is a pressure of the exposure chamber (16), $P_{RL}$ is a pressure of the mask transfer system accommodating chamber (18), and $P_{WL}$ is a pressure of the substrate transfer system accommodating chamber (20).

Moreover, it is characterized that $P_{RL} \geq P_{CR}$ is satisfied where $P_{CR}$ is a pressure of a predetermined environment (for example, the atmospheric pressure in the clean room) of the exposure apparatus (10).

Furthermore, it is characterized that $P_{WL} \geq P_{CD}$ is satisfied where $P_{CD}$ is a pressure of a substrate processing device which is in-line connected to the exposure apparatus (10).

According to the present invention, since turbulence due to gas flow is reduced and the generation of air fluctuation is prevented by setting the pressure of the column chamber (34) in which the substrate (W) is placed for the longest period in the chamber (12), to be higher than the pressure of the other air-conditioning chambers (16, 18, and 20), it becomes possible to improve the measurement accuracy of, for example, a position detection system (an interferometer, etc.) which detects positional information of a mask stage or a substrate stage, a focus point detection system which detects a relative positional relationship between a field of a projection optical system and a substrate, and various measuring systems, such as an alignment system which detects a mark on a substrate, etc. Moreover, since contaminants can be prevented from flowing into the column chamber (34), it becomes possible to prevent the deterioration of resist when the resist is applied on the substrate (W). Furthermore, since no contaminants flow into the column chamber (34) which is the space for the optical path of an exposure light, it becomes possible to prevent the attenuation in the amount of the exposure light. Accordingly, since the cleanliness of the substrate (W) or the space of optical path for the exposure light can be maintained to be high by increasing the pressure of the column (34) with respect to the other air-conditioning chambers (16, 18, and 20), it becomes possible to carry out an accurate exposure process. Also, by setting the pressure of the substrate transferring system accommodating chamber (20) in which the substrate (W) is placed for the second longest period after the column chamber (34), to be highest after the column chamber (34) among the other air-conditioning chambers (16 and 18), it becomes possible to prevent contaminants from flowing into the substrate transferring system accommodating chamber (20). Accordingly, it becomes possible to prevent resist deterioration when the resist is applied onto the substrate (W). Note that the above-mentioned exposure chamber may accommodated the whole main body of the exposure chamber, or it may accommodate only a part thereof. Also, the space of the air-conditioning chambers may be clearly defined by housings, etc., or it can be a space to which a gas, the temperature etc., of which is controlled, is simply supplied without using housings, partitioning plates, and so forth.

Also, the exposure apparatus according to the present invention may be an exposure apparatus which transfers a pattern of a first object onto a second object, which includes a first chamber in which at least the first object is allocated among a main body of the exposure apparatus which exposes the second object using an illumination beam via the first object; a second chamber in which at least the second object is allocated among the main body of the exposure apparatus; a third chamber in which a first transfer system is allocated which transfers the first object to/from the first chamber; a fourth chamber in which a second transfer system is allocated which transfers the second object to/from the second chamber; and a gas supply device which supplies a gas to each of the first chamber, second chamber, third chamber, and fourth chamber, at least a temperature of the gas being controlled; wherein pressure of each of the chambers is set so as to satisfy:

$$P_C \geq P_{WL} \geq P_B \geq P_{RL}$$

where $P_B$ is a pressure of the first chamber, $P_C$ is a pressure of the second chamber, $P_{RL}$ is a pressure of the third chamber, and $P_{WL}$ is a pressure of the fourth chamber.

In another embodiment of the present invention, the pressure of each of the chambers is set to be about the same or higher than a pressure $P_{CR}$ of a predetermined environment of the exposure apparatus.

In yet another embodiment of the present invention, the pressure of each of the chambers is set to be higher than the pressure $P_{CR}$ of the predetermined environment, and the pressure $P_{RL}$ of the third chamber is set so that a difference in pressure with respect to the predetermined environment becomes about 0.5 [Pa] or greater.

In yet another embodiment of the present invention, the pressure $P_C$ of the second chamber is set so that a difference in pressure with respect to the predetermined environment becomes about 1.5 [Pa] or smaller.

In yet another embodiment of the present invention, the pressure $P_{WL}$ of the fourth chamber is set to be about the same or higher than a pressure $P_{CD}$ of a substrate processing device which is in-line connected to the exposure apparatus.

In yet another embodiment of the present invention, the pressure $P_{WL}$ of the fourth chamber is set to be higher than the pressure $P_{CD}$ of the substrate processing device and lower than the pressure $P_C$ of the second chamber.

In yet another embodiment of the present invention, the pressure $P_{WL}$ of the fourth chamber is set to be higher than the pressures $P_B$ and $P_{RL}$ of the first and third chambers, respectively.

In yet another embodiment of the present invention, a pressure detection device is further provided with a pressure detection device which detects pressure information relating to at least one of the first, second, third, and fourth chambers.

In yet another embodiment of the present invention, the pressure $P_C$ of the second chamber is set to be higher than the pressure $P_{WL}$ of the fourth chamber.

In yet another embodiment of the present invention, a device manufacturing method is provided which comprises the step of transferring a pattern onto a photosensitive object using the above exposure apparatus.

BEST MODE FOR CARRYING OUT THE INVENTION

Figure 1:
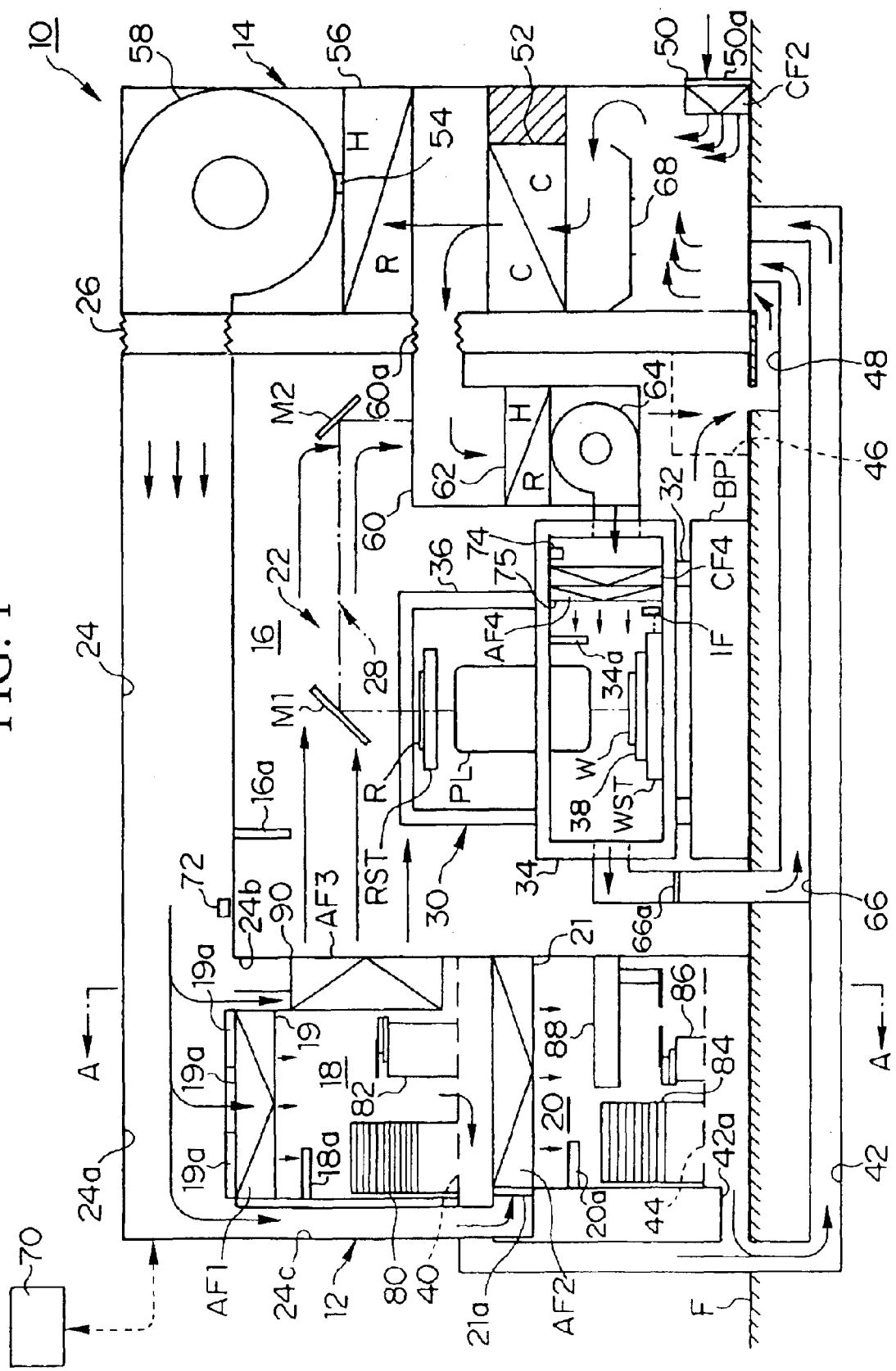
FIG. 1 is a schematic structural diagram showing an embodiment of an exposure apparatus of the present invention.

Hereinafter, the exposure apparatus according to the present invention will be explained with reference to the drawings. FIG. 1 is a schematic structural diagram showing an embodiment of an exposure apparatus 10 of the present invention.

The exposure apparatus 10 includes a main chamber 12 which is placed on a floor F (or surface at which a caster frame, etc., is disposed) in a clean room, and a machinery chamber 14 which is placed adjacent to the main chamber 12.

Environmental conditions (cleanliness, temperature, pressure, humidity, etc.) inside the main chamber 12 are maintained to be almost constant, and a large chamber 16 at the machinery chamber 14 side and two small chambers 18 and 20, which are disposed to be two-tier at the opposite side of the machinery chamber 14, are placed inside the main chamber 12. Among them, the large chamber 16 is used as an exposure chamber in which a main body 22 of the exposure apparatus is accommodated. Hereinafter, the large chamber 16 is referred to as an exposure chamber 16.

In the above-mentioned small chamber 18, a reticle library 80 which stores reticles as a plurality of masks, and a reticle loader 82 which is made of a horizontal multi-joint type robot, are placed in that order viewed from the opposite side of the exposure chamber 16. A reticle R is transferred onto a reticle stage RST, which forms the main body 22 of the exposure apparatus and will be described later, by the reticle loader 82 and is then transferred from the reticle stage RST also by the reticle loader 82. In this embodiment, a reticle loader system is formed as a mask transfer system by the reticle library 80 and the reticle loader 82, and the reticle loader system is accommodated in the small chamber 18. Accordingly, the small chamber 18 is hereinafter referred to as a reticle loader chamber (a mask transfer system accommodating chamber) 18.

Note that the reticle loader system is not limited to the above-mentioned configuration, and a bottom open-type closed cassette (container) which is capable of accommodating a plurality of reticles may be used instead of the reticle library, for example. Also, a mechanism capable of sliding a transfer arm may be used as a reticle loader. Also, a reticle storing unit (the reticle library 80) may be separately placed from the reticle loader 82 in a different chamber. Moreover, the above-mentioned closed type cassette may be placed on the upper portion of the reticle loader 18, and then the bottom may be opened while maintaining the air-tightness thereof so that a reticle may be transferred to the inside the reticle loader chamber 18. Furthermore, a rack or a casing which temporary stores reticles transferred from a closed type cassette (e.g., SMIF Pod, etc.) disposed at the outside of the reticle loader chamber 18, may be placed inside the reticle loader chamber 18. That is, it is possible to place only the reticle loader in the small chamber 18.

Also, a wafer carrier 84 for storing a wafer as a plurality of substrates, a horizontal multi-joint type robot 86 which deposits and withdraws a wafer with respect to the wafer carrier 84, and a wafer transferring device 88 which transfers a wafer between the robot 86 and a wafer stage WST that forms the main body 22 of the exposure apparatus are accommodated in the small chamber 20. In this embodiment, a wafer loader system as a substrate transfer system is formed by the wafer carrier 84, the robot 86, and the wafer transfer device 88, and the wafer loader system is accommodated in the small chamber 20. Accordingly, the small chamber 20 is hereinafter referred to as a wafer loader chamber (a substrate transfer system accommodating chamber) 20.

Note that the wafer loader system is not limited to the above-mentioned configuration, and it is possible, for example, to form the wafer loader system only by a robot, or to place only the wafer loader in the wafer loader chamber 20.

The above-mentioned exposure chamber 16, the reticle loader chamber 18, and the wafer loader 20, are connected to the machinery chamber 14 via a supply passage 24 which functions as a supply passage and is made of a material having anti-gas leaking property, such as Special Use Stainless Steel (SUS) and Teflon.

The main body 22 of the exposure apparatus accommodated in the exposure chamber 16 includes an illumination optical system including mirrors M1 and M2, a projection optical system PL disposed below the illumination optical system 28, the reticle stage RST which is placed between the projection optical system PL and the illumination optical system 28 and holds the reticle R as a mask, the wafer stage WST which is disposed below the projection optical system PL and holds the wafer W as a substrate, a main column 30 which holds the projection optical system PL and on which the wafer stage WST is mounted, and so forth.

The illumination optical system 28 includes, besides the mirrors M1 and M2, an optical integrater, a field stop, etc. (none of which is shown in the figures), and these optical members are accommodated in an illumination system housing, which is not shown in the figure, with a predetermined positional relationship to form the illumination optical system. The illumination optical system 28 is connected to an excimer laser, such as a KrF excimer laser (having an output wavelength of 248 nm) and an ArF excimer laser (having an output wavelength of 193 nm), which functions as a light source which is not shown in the figures, via an arranged optical system (a relay optical system) which is also not shown in the figures. The above-mentioned arranged optical system includes, at least a part thereof, a so-called beam matching unit, which is an optical system used for adjusting an optical axis between the light source and the illumination optical system 28. Also, although not shown in the figures, the inside of an illumination optical system housing in which the illumination optical system 28 is accommodated, and the inside of a housing (lens-barrel) which is placed between the light source (i.e., the above-mentioned excimer laser in this embodiment) and the illumination optical system 28 and accommodates, in at least a part thereof, the above-mentioned arranged optical system including the beam matching unit, are purged with an inert gas (for example, nitrogen, helium, etc.) so that the cleanliness thereof is excellently maintained. Note that the configuration of the main column 30, etc., is not limited to the one shown in FIG. 1, and it is possible, for example, to support a main frame (i.e., an upper plate of the main column 34 in this embodiment) supporting the projection optical system PL using a vibration isolated table different from the vibration isolated table 32 which supports a stage base (i.e., a bottom plate of the main column 34 in this embodiment) on which the wafer stage WST is disposed, and to dispose the vibration isolated table different from the table 32 on the base plate BP or the floor surface F.

Note that at least a part of the illumination optical system 28 may be disposed at the outside of the exposure chamber 16. Also, regardless of the above, it is possible to place a part thereof excluding the light source, the arranged optical system and the illumination optical system 28 (for example, the wafer stage WST, etc.) in a housing different from the exposure chamber. In the above case, the above-mentioned different housing may be placed inside the exposure chamber or outside the exposure chamber. That is, it is sufficient that as long as at least a part of the main body of the exposure apparatus is disposed in the exposure chamber 16, and the members placed in the exposure chamber 16 and the configuration thereof may be arbitrary determined.

The main column 30 is supported above a base plate BP which is disposed on the bottom surface of the main chamber 12 via a plurality of vibration isolated tables 32. The main column 30 includes a main column (main chamber) 34 which is supported by the vibration isolated tables 32, and a support column 36 which is disposed above the main column 34. The projection optical system PL is supported by a main frame, which forms a top surface of the main column 34, so that the optical axis direction thereof faces the up and down direction via a supporting member called a first invar. In this embodiment, a reduced optical system of ¼ or ⅕ projection magnification is used as the projection optical system PL. The support column 36 supports at least a part of the illumination system housing, which is not shown in the figures, from the downward direction.

The wafer stage WST is driven in two-dimensional directions on a stage base, which forms a bottom plate of the main column 34, by a driving unit such as a plane motor and a linear motor. A wafer W is fixed on the upper surface of the wafer stage by means of a vacuum adsorption, etc., via a wafer holder 38. The position of the wafer stage WST in the XY plane and the revolution amount thereof (i.e., at least one of the yawing amount, pitching amount, and rolling amount) are measured by a laser interferometer IF with a resolving power of about 0.5–1 nm, for example, via a mobile mirror (not shown in the figures) which is disposed on the wafer stage WST.

The reticle stage RST is mounted on a reticle stage base which forms the top portion of a supporting member called a second invar disposed on the upper surface of the main column 34. For the case where the main body 22 of the exposure apparatus is a stationary exposure type, the reticle stage RST is formed so as to be finely driven within the horizontal plane, and for the case where the main body 22 of the exposure apparatus is a scanning exposure type, the reticle stage RST is formed, in addition to the above, so as to be driven within a predetermined stroke range in a predetermined scanning direction.

According to the main body 22 of the exposure apparatus having the above configuration, pulsed ultraviolet light emitted from an excimer laser, which is not shown in the figures, is modified to have a required magnitude and uniform illuminance by the illumination optical system 28 including various lenses and mirrors, and illuminates the reticle R on which a predetermined pattern is formed so that the pattern formed on the reticle R is transferred in a reduced scale, via the projection optical system PL, onto each shot area on the wafer W which is supported on the wafer stage WST.

In this embodiment, one on which a positive type chemical amplification resist is applied as a sensitizer is used as the wafer W.

One end of the supply passage 24 is separated into two branched passages, and one of them, a branched passage 24a, is connected to the reticle loader chamber 18. A filter box AF1 including an ultra low penetration air-filter (ULPA filter), which functions as an air filter for removing particles contained in a gas flowing into the reticle loader chamber 18, and a filter plenum is disposed at an outlet portion 19 of the reticle loader chamber 18. Also, a return unit 40 is provided at the opposite side of the filter box AF1 in the reticle loader chamber 18, and one end of a return duct 42 which functions as an exhaust passage is connected to the outside portion of the return unit 42. Also, the other end of the return duct 42 is connected to a part of the bottom surface of the machinery chamber 14.

The branched passage 24a is further provided with a branched passage 24c, and the branched passage 24c is connected to the wafer loader chamber 20. A filter box AF2 including an ULPA filter, which functions as an air filter for removing particles contained in a gas flowing into the wafer loader chamber 20, and a filter plenum, are disposed at an outlet portion 21 of the wafer loader chamber 20. The filter box AF2 includes a chemical filter. Also, a return unit 44 is provided at the opposite side of the filter box AF2 in the wafer loader chamber 20, and a discharge port 42a which communicates with the return duct 42 is disposed at the opposite side of the wafer loader chamber 20.

Figure 2:
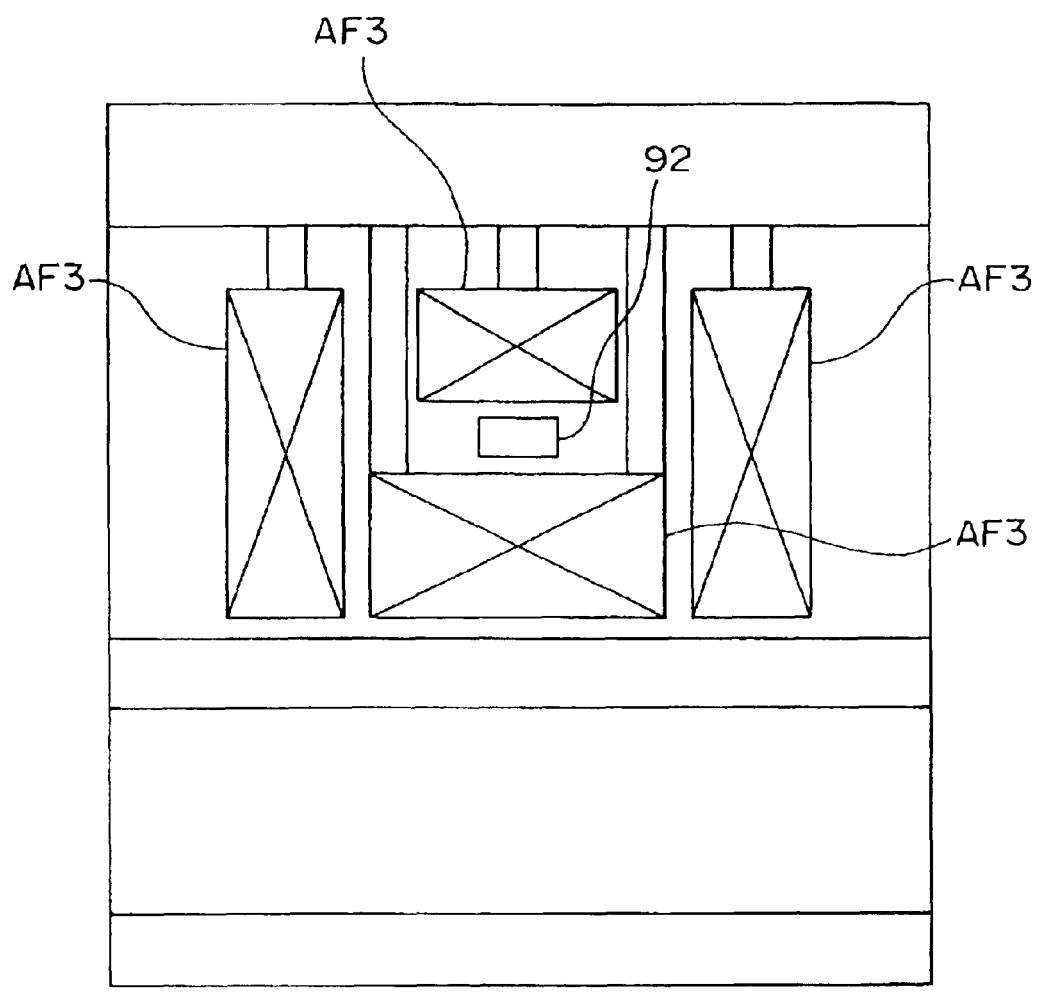
FIG. 2 is a diagram showing a cross-sectional view taken along line A—A in FIG. 1.

Also, the other branched passage 24b is connected to a filter box AF3 including an ULPA filter (which stands for Ultra Low Penetration Air-filter), which functions as an air filter for removing particles contained in a gas flowing into the exposure chamber 16, and a filter plenum. The filter box AF3 is disposed at the reticle loader chamber 18 side of an outlet portion 90 formed at the boundary portion between the reticle loader chamber 18 and the exposure chamber 16. A uniform flow is supplied from the outlet portion 90 to the upper space of the exposure chamber 16 as a side flow. As indicated in FIG. 2, which shows a cross-sectional view taken along the line A—A shown in FIG. 1, a plurality of the filter boxes AF3 are disposed, excluding a reticle transfer area 92, around the boundary portion between the reticle loader chamber 18 and the exposure chamber 16 at which the outlet portion 90 is formed.

Also, a return unit 46 is disposed on the bottom portion of the exposure chamber 16 at the machinery 14 side, and a discharge port which communicates with one end of the return duct 48 is formed as an exhaust passage at the bottom surface of the chamber 23 located below the return unit 46. Also, the other end of the return duct 48 is connected to a part of the bottom surface of the machinery chamber 14.

An outlet air (OA) port 50 is formed at the bottom portion of the machinery chamber 14 opposite the main chamber 12, and a chemical filter CF2 is disposed so as to oppose the OA port 50. The pressure inside the main chamber 12, especially inside the exposure chamber 16, is always maintained to be positive with respect to the outside in order to maintain its cleanliness. Accordingly, gas is discharged to the outside from the front surface of the main chamber 12, an inline interface portion, etc. Thus, the OA port 50 is provided in order to supply outside air to compensate the lost gas. Also, according to the present invention, in order to prevent deterioration of the chemical amplification resist, the chemical filter CF2 is disposed at the OA port 50 portion to remove chemical substances (contaminants) contained in the gas that is supplied into the inside of the apparatus via the OA port 50 so that only clean gas may be supplied.

A cooler (dry coil) 52 as a cooling device is disposed in the machinery chamber 14 at a position somewhat below the center in the height direction thereof. Although not shown in the figure, a temperature sensor which detects the temperature at the surface of the cooler is disposed at the outlet portion of the cooler 52. Values detected by the temperature sensor are supplied to a control unit 70.

A first heater 56 as a heating device is disposed at a gas passage in the machinery chamber 14 above the cooler 52. A first temperature sensor 54 which detects the temperature of heated air is disposed in the vicinity of an outlet of the first heater 56, and values detected by the first temperature sensor 54 are supplied to the control unit 70. Also, a first fan 58 is disposed at the outlet portion of the machinery chamber 14 above the first heater 56.

Moreover, a branched passage 60 through which about ⅕ of the gas that passed through the cooler 52 from the lower to the upper direction flows is disposed at the gas passage in the machinery chamber 14 below the first heater 56. An end portion of the branched passage 60 at the machinery chamber 14 side is formed by a flexible and expandable bellows-like member 60a. A part of the branched passage 60 located at the opposite side of machinery chamber with respect to the bellows-like member 60a is placed in the exposure chamber 16. A second heater 62 which functions as a heating device, and a second fan 64 are sequentially disposed in the branched passage 60. An outlet 75 for the gas in the vicinity of the wafer stage WST is disposed at the opposite side of the second fan 64 in the machinery chamber, and a filter box AF4 including a chemical filter CF4, the ULPA filter, and the filter plenum is disposed at the outlet 75 portion. An opening at one end of a return duct 66 which functions as an exhaust passage is placed near the wafer loader chamber 20 of the main column 34 so as to oppose the outlet 75 provided with the filter box AF4, and the other end of the return duct 66 is connected to a part of the bottom surface of the machinery chamber 14.

Also, an opening is provided with a part of the bottom surface of the machinery chamber 14 to which three return ducts 42, 48, and 66 are connected.

As the chemical filters CF2 and CF4 used in the embodiment of the present invention, one which is capable of removing not only basic gases, such as an ammonia gas, silicon based organic compounds, such as siloxane and silazane, and hydrocarbons present in a clean room, but also chemical contaminants, such as plasticizer and flame retardant, are employed. More specifically, activated carbon filter or zeolite filter is used as the chemical filters CF2 and CF4. Also, a drain pan 68 is disposed below the cooler 52 in the mechanical chamber 14.

A second temperature sensor 72 for detecting the temperature of a gas in the supply passage 24 is disposed at a portion of the branched area of the supply passage 24 near the mechanical chamber 14 side in the main chamber 12. The values of the temperature detected by the second temperature sensor 72 are output to the control unit 70.

Also, a third temperature sensor 74 for detecting the temperature of a gas which is transferred by the second fan 64 is disposed upstream of the chemical filter CF4. The values of the temperature detected by the third temperature sensor 74 are output to the control unit 70.

Figure 5A:
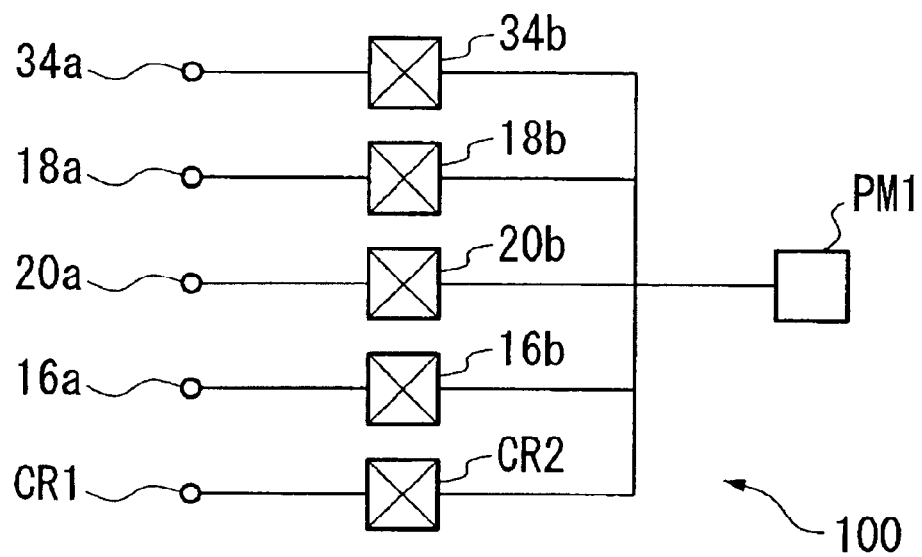
FIGS. 5(a) and 5(b) are schematic diagrams showing structures of a pressure detection device.

A part 34a of a pressure detector (a pressure sampling port in this embodiment) which detects the pressure inside the main column 34 (air-conditioning chamber) is disposed in the main column 34. FIG. 5(a) is a diagram showing a schematic structure of a pressure detector used in this embodiment. In FIG. 5(a), the pressure sampling port 34a is connected to a sensor unit PM1 (a pressure sensor) via an electromagnetic valve 34b. Also, in a pressure detector 100, pressure sampling ports 18a, 20a, 16a, and CR1, which are disposed at the outside of the reticle loader chamber 18, the wafer loader chamber 20, the exposure chamber 16, and the main chamber 12, respectively, which will be described later, are connected to the pressure sensor PM1 via the corresponding electromagnetic valves 18b, 20b, 16b, and CR2, respectively. Accordingly, the pressure inside each of the air-conditioning chamber and outside the main chamber 12, i.e., the atmospheric pressure in the clean room in which the exposure apparatus is placed, can be detected by switching the electromagnetic valve. The pressure detector 100 can detect minute change in pressure of 0.5 Pa or less, for example, and outputs the detected value (i.e., pressure information) to the control unit 70. In addition, each of the pressure sampling ports (hereinafter referred to as PSP including piping portion connected to the pressure sensor PM1) is made of a material, such as cleaned Teflon coated pipe and SUS pipe, which prevents the generation of an outgas which adversely influences exposure processes.

The PSP 34a is disposed in the main column 34 near the outlet 75 for the gas which is supplied from the branched passage 60 and the second fan 64 side and ejected in the vicinity of the wafer stage WST. Information relating to the pressure inside the main column 34 detected by the pressure detector 100 is output to the control unit 70. Also, when the PSP 34a is located in the vicinity of the outlet 75, the pressure detector 100 is placed so that the inlet opening of the Teflon coated pipe, which is the PSP 34a, crosses the direction of the gas flow. Accordingly, the gas does not flow directly into the Teflon coated pipe and the pressure sampling port 34a is not affected by the dynamic pressure components of the ejected gas.

The PSP 18a which detects the pressure inside the reticle loader chamber 18 is disposed in the reticle loader chamber 18. Similar to the PSP 34a disposed in the main column 34, the PSP 18a is connected to the pressure sensor PM1 via the electromagnetic valve 18b, and the pressure detector 100 outputs information relating to the detected pressure inside the reticle loader 18 to the control unit 70. Similar to the PSP 34a disposed in the main column 34, the PSP 18a is placed so that the inlet opening of the Teflon coated pipe crosses the direction of the gas flow. Accordingly, the gas does not flow directly into the Teflon coated pipe and the pressure sampling port 18a is not affected by the dynamic pressure components of the ejected gas.

The PSP 20a which detects the pressure inside the wafer loader chamber 20 is disposed in the wafer loader chamber 20. Similar to the PSP 34a disposed in the main column 34, the PSP 20a is connected to the pressure sensor PM1 via the electromagnetic valve 20b, and the pressure detector 100 outputs information relating to the pressure inside the wafer loader 20 to the control unit 70. Similar to the PSP 34a disposed in the main column 34, the PSP 20a is placed so that the inlet opening of the Teflon coated pipe crosses the direction of the gas flow. Accordingly, the gas does not flow directly into the Teflon coated pipe and the pressure sampling port 20a is not affected by the dynamic pressure components of the ejected gas.

The PSP 16a which detects the pressure inside the exposure chamber 16 is disposed in the exposure chamber 16. Similar to the PSP 34a disposed in the main column 34, the PSP 16a is connected to the pressure sensor PM1 via the electromagnetic valve 16b, and the pressure detector 100 outputs information relating to the pressure inside the exposure chamber 16 to the control unit 70. Similar to the PSP 34a disposed in the main column 34, the PSP 16a is placed so that the inlet opening of the Teflon coated pipe crosses the direction of the gas flow. Accordingly, the gas does not flow directly into the Teflon coated pipe and the pressure sampling port 16a is not affected by the dynamic pressure components of the ejected gas.

Figure 4:
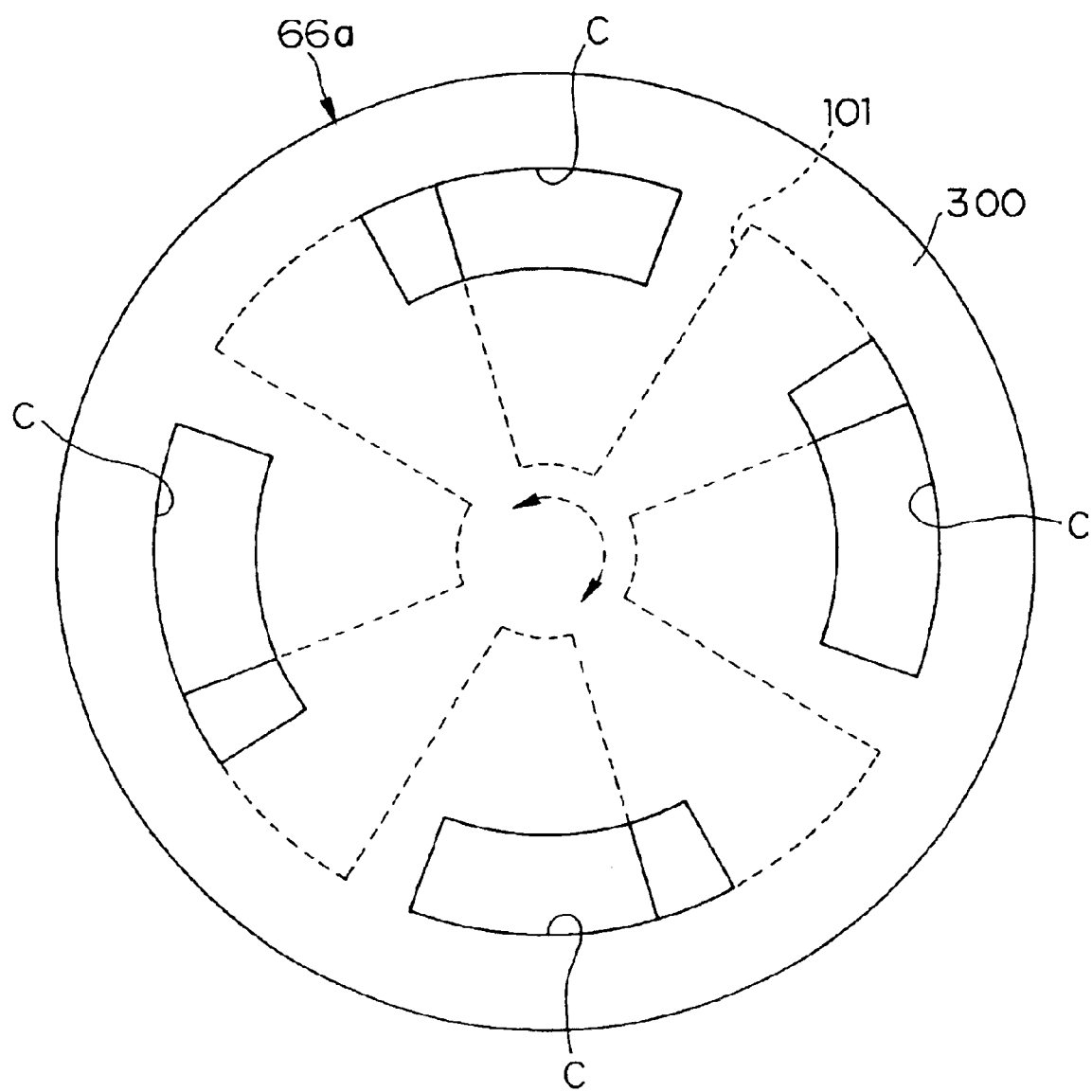
FIG. 4 is a diagram showing a passage opening rate adjusting unit.

A flow controller (a flow path opening rate adjusting unit, a pressure adjustment device) 66a which controls the flow rate of the gas passing through the return duct 66 by adjusting the opening rate of the passage is disposed at the middle of the return duct 66 which is an exhaust passage connecting to the main column 34. The flow controller 66a includes, for example, an opened substrate 300 which is fixed to the return duct 66 and has a plurality of opening portions C, and an opening rate changing member 101 which changes the opening rate of each of the opening portions C as shown in FIG. 4. The opening rate changing member 101 is driven by an actuator, which is not shown in the figure, and adjusts the opening rate of the opening portion C, i.e., the opening rate of the return duct 66 by rotating a predetermined amount. The driving amount of the actuator which rotates the opening rate changing member 101, i.e., the opening rate of the flow path in the return duct 66 by the flow controller 66a is controlled by the control unit 70. The flow controller 66a decreases the pressure inside the main column 34 by increasing the opening rate of the flow path to increase the amount of gas passing through the return duct 66, i.e., by increasing the amount of exhaust gas from the main column 34. On the other hand, the flow controller 66a increases the pressure inside the main column 34 by decreasing the opening rate of the flow path to decrease the amount of gas passing through the return duct 66, i.e., by decreasing the amount of exhaust gas from the main column 34.

Figure 3:
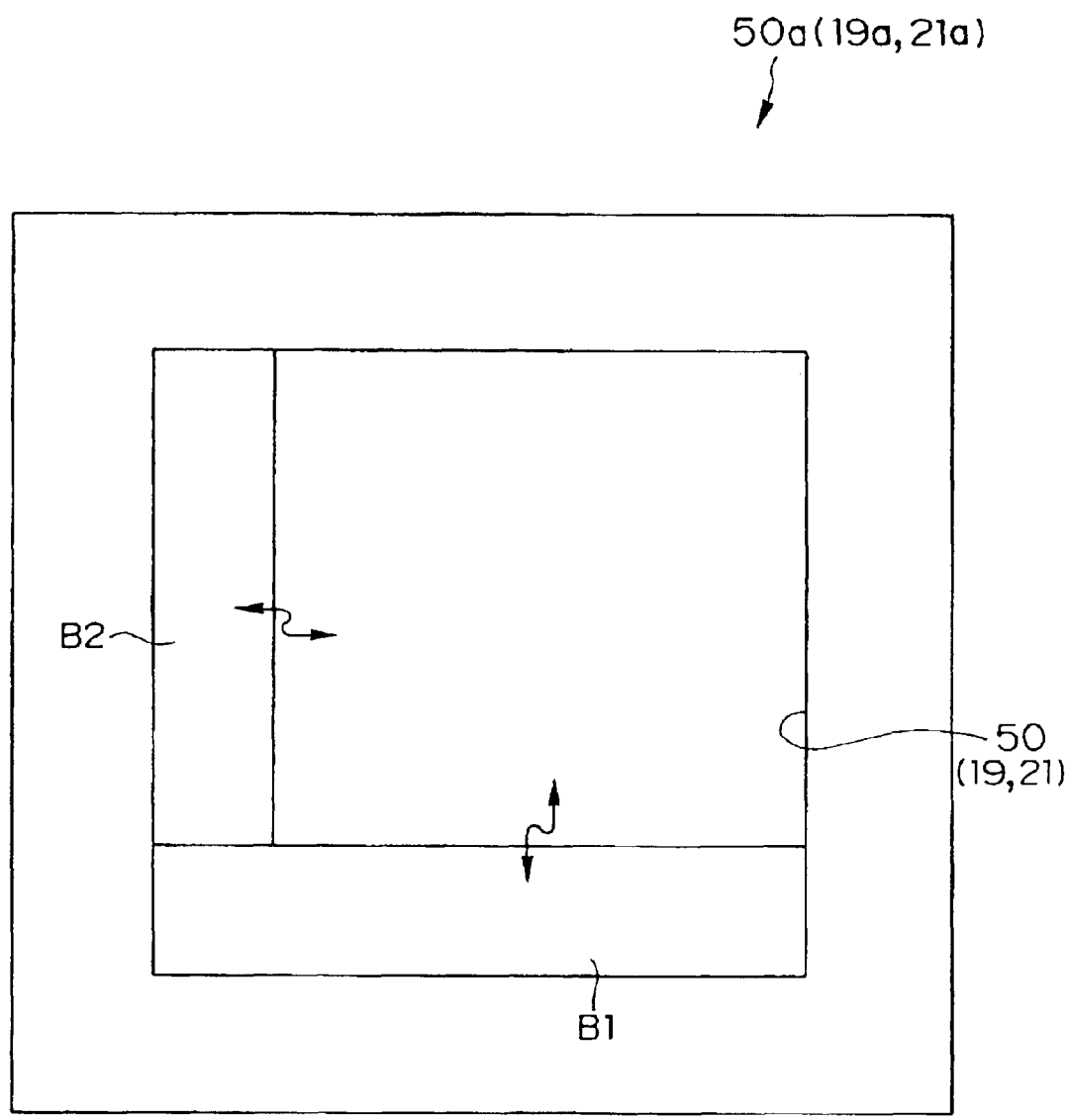
FIG. 3 is a diagram showing a passage opening rate adjusting unit.

A flow controller (a flow path opening rate adjusting unit, a pressure adjustment device) 19a which controls the flow rate of the gas passing through the outlet 19 by adjusting the opening rate of the passage is disposed at the branched passage 24a, which functions as a supply passage and is connected to the reticle loader chamber 18. As shown in FIG. 3, the flow controller 19a is capable of adjusting the opening rate of the passage by, for example, moving two blade portions B1 and B2 which are movable in the direction crossing the passage using an actuator not shown in the figure. Note that a plurality of the flow controllers 19a are provided in parallel in this embodiment as shown in FIG. 1. The flow rate (i.e., gas supplying amount) of the gas at the outlet 19 from which the gas is ejected towards the reticle loader chamber 18 is adjusted by the opening rate of the passage determined by the blade portions B1 and B2, and the pressure inside the reticle loader chamber 18 is adjusted in accordance with the flow rate of the gas which is adjusted in the above-mentioned manner. Also, the opening rate of the passage by the flow controller 19a is controlled by the control unit 70. The flow controller 19a increases the pressure inside the reticle loader chamber 18 by increasing the opening rate of the passage to increase the supplying amount of gas to the reticle loader chamber 18. Also, the flow controller 19a decreases the pressure inside the reticle loader chamber 18 by decreasing the opening rate of the passage to decrease the supplying amount of gas to the reticle loader chamber 18. Note that although it is explained above that the opening rate of the flow controller 19a is automatically adjusted by moving the blade portions B1 and B2 using the actuator, which is not shown in the figure, it is possible to change the opening rate manually by an operator without using the actuator.

A flow controller (a flow path opening rate adjusting unit, a pressure adjustment device) 21a controls the flow rate of the gas passing through the branched passage 24a by adjusting the opening rate of the passage is disposed at the branched passage 24c, which functions as a supply passage and is connected to the wafer loader chamber 20. Similar to the flow controller 19a, as shown in FIG. 3, the flow controller 21a is also capable of adjusting the opening rate of the passage by moving two blade portions B1 and B2 which are movable in the direction crossing the passage using an actuator which is not shown in the figure. The flow rate (i.e., gas supplying amount) of the gas at the outlet 21 from which the gas is ejected towards the wafer loader chamber 20 is adjusted by the opening rate of the branched passage 24c determined by the blade portions B1 and B2, and the pressure inside the wafer loader chamber 20 is adjusted in accordance with the flow rate of the gas which is adjusted in the above-mentioned manner. Also, the opening rate of the passage by the flow controller 21a is controlled by the control unit 70. The flow controller 21a increases the pressure inside the wafer loader chamber 20 by increasing the opening rate of the passage to increase the supplying amount of the gas to the wafer loader chamber 20. Also, the flow controller 21a decreases the pressure inside the wafer loader chamber 20 by decreasing the opening rate of the passage to decrease the supplying amount of the gas to the wafer loader chamber 20.

A flow controller (a flow path opening rate adjusting unit, a pressure adjustment device) 50a which controls the flow rate of the gas taken into the main chamber 12 by adjusting the opening rate of the passage is disposed at the OA port through which the outside air is supplied to the main chamber 12. As shown in FIG. 3, the flow controller 50a is also capable of adjusting the opening rate of the passage by moving two blade portions B1 and B2 which are movable in the direction crossing the passage. The amount of the gas which is taken through the OA port 50 and supplied to the exposure chamber 16 of the main chamber 12 via the machinery chamber 14, a connecting portion 26, and the supply passage 24 is adjusted by the opening rate of the passage at the OA port 50, which is determined by the flow controller 50a. Then, the pressure inside all of the air-conditioning chambers (16, 18, 20, and 34) is adjusted in the same way depending on the flow rate of the gas at the OA port 50 adjusted by the flow controller 50a. Here, the flow controller 50a increases the pressure in each of the air-conditioning chambers by increasing the opening rate of the passage to increase the amount of the gas supplied to all of the air-conditioning chambers. The flow controller 50a, on the other hand, decreases the pressure in each of the air-conditioning chambers by decreasing the opening rate of the passage to decrease the amount of the gas supplied to all of the air-conditioning chambers. In this manner, the difference in pressure among the atmospheric pressure in the clean room in which the exposure apparatus is disposed, a substrate processing device which is connected in-line with the exposure apparatus, and the pressure in a coater and developer can be adjusted, and it becomes possible to set the pressure in each of the air-conditioning chambers to be the same or greater than (for example, positive pressure) the atmospheric pressure in the clean room or the pressure in the coater and developer.

As explained above, in the exposure apparatus 10, the inside of the main chamber 12 is divided into a plurality of air-conditioning chambers of the main column 3, the reticle loader chamber 18, the wafer loader chamber 20, and the exposure chamber 16, and each of the air-conditioning cambers is provided with the PSP 34a, 18a, 20a, and 16a, respectively, of the pressure detector 100 which detects the pressure. Each of the detection results obtained by the pressure detector is output to the control unit 70, and the control unit 70 controls, depending on the detection results of the pressure detector, each of the flow controllers 66a, 19a, 21a, and 50a disposed at the supply passage or the exhaust passage for each of the air-conditioning chambers so that each of the main column 34, the reticle loader chamber 18, the wafer loader chamber 20, and the exposure chamber 16 has a predetermined difference in pressure.

Next, the air-conditioning in the exposure apparatus 10 having the above-explained configuration will be explained.

The first and the second fans 58 and 64 are operated by the control unit 70 so that gas is transferred to the reticle loader chamber 18, the wafer loader chamber 20, the exposure chamber 16, and in the vicinity of the wafer stage WST in the main column 34 via the filter boxes, AF1, AF2, AF3, and AF4, respectively, to perform the air-conditioning for the above-mentioned areas. In this case, the air-conditioning is carried out by the down-flow in the reticle loader chamber 18 and the wafer loader chamber 20. Also, the above-mentioned air-conditioning of each area of the main body 22 of the exposure apparatus, which is being operated to perform the exposure process, is carried out by the side-flow. Then, the gas which is returned to the return duct 42 via the return units 40 and 44, the gas which is returned to the return duct 48 via the return unit 46, and the gas which is returned to the return duct 66 passes through the outlet of the return duct at the machinery chamber 14 side.

The gas which passed through the outlet is taken into the apparatus from the outside via the OA port 50, and is mixed with the chemical-clean gas which passed through the chemical filter CF2 to be cooled down to a predetermined temperature by the cooler 52 which forms the air-conditioning unit.

Then, 80% of the gas that is cooled down to the predetermined temperature by passing through the cooler 50 is transferred into the first heater 56, and the rest, 20% of the gas, is transferred into the second heater 62 to be heated to a respective target temperature. In the control unit 70, the first heater 56 is feedback controlled based on the detection value of the second temperature sensor 72, and the second heater 62 is feedback controlled based on the detection value of the third temperature sensor 74. In this case, the target temperature (including the temperature control range) of the gas ejected into the inside of the exposure chamber 16, etc., via the supply passage 24, and the target temperature (including the temperature control range) of the gas ejected in the vicinity of the wafer stage WST via the branched passage 60 can be set independently.

Then, the gases which are heated to the respective target temperature by the first and second heaters 56 and 62, respectively, to reach a degree of significant chemical cleanliness are transferred by the first and second fans 58 and 64, respectively. The gas which is transferred by the first fan 58 is supplied into each of the reticle loader chamber 18, the wafer loader chamber 20, and the exposure chamber 16, via the supply passage 24, and the filter boxes AF1, AF2, and AF3 in the main chamber 12. Also, the gas which is transferred by the second fan 64 and passed through the chemical filter CF4 is supplied in the vicinity of the wafer stage WST by passing through the filter box AF4.

Since particles contained in the gas are almost completely removed when passing through the ULPA filter in the filter boxes AF1, AF2, AF3, and AF4, only gas having high cleanliness in terms of not containing fine particles, such as chemical contaminants, is supplied to the reticle loader chamber 18, the wafer loader chamber 20, the exposure chamber 16, and in the vicinity of the wafer stage WST in the main column 34, and the reticle loader system, the wafer loader system, and the main body 22 of the exposure apparatus are air-conditioned by the normal gas. After the completion of the air-conditioning, gas which is chemically contaminated and includes chemical contaminants derived from the outgasing from the main body 22 of the exposure apparatus, etc., is returned into the return ducts 42, 48, and 66. Thereafter, the air-conditioning of each area is repeated in the manner mentioned above.

Each of the flow controllers 66a, 19a, 21a, and 50a which functions as the pressure controlling device disposed at the supply passage or the exhaust passage for each of the air-conditioning chambers is controlled when carrying out the air-conditioning of each area. At that time, as explained above, the pressure inside the main chamber 12 is always maintained positive with respect to the pressure outside (the clean room in this embodiment) by taking the outside air through the OA port 50. The pressure inside the main chamber 12 is set to be positive by about 0.5 Pa, for example, with respect to the outside (the clean room) by adjusting the flow controller 50a which functions as a pressure controlling device disposed at the OA port 50. By maintaining the pressure inside the main chamber 12 positive with respect to the outside, the flow of gas from the outside of the main chamber 12 to the inside can be prevented and the cleanliness may be maintained.

Also, the control unit 70 adjusts the pressure using each of the flow controllers, which functions as a pressure controlling device, based on the detection results obtained by the pressure detection units 34a, 18a, 20a, and 16a, respectively, provided with each of the air-conditioning chambers so as to satisfy:

$$P_C \geq P_{WL} \geq P_B \geq P_{RL} \qquad (1)$$

where $P_C$ is the pressure in the main column 34, $P_{RL}$ is the pressure in the reticle loader chamber 18, $P_{WL}$ is the pressure in the wafer loader chamber 20, and $P_B$ is the pressure in the exposure chamber 16.

Moreover, it is adjusted to be $P_{RL} \geq P_{CR}$ where $P_{CR}$ is the pressure in a predetermined environment (i.e., the clean room) of the exposure apparatus 10. Furthermore, it is adjusted to satisfy the relationship of $P_{WL} \geq P_{CD}$ where $P_{CD}$ is the pressure inside a substrate processing device (i.e., the coater and developer, etc.) which is inline-connected to the exposure apparatus 10.

That is, it is necessary to protect the resist applied on the wafer W in order to accurately carry out an exposure process, and for this reason, it is necessary to maintain the cleanliness to be the highest in an air-conditioning chamber in which the wafer W is placed for the longest period during the series of process carried out in the exposure apparatus. Accordingly, the pressure $P_C$ in the main column 34 in which the wafer stage WST for mounting the wafer W is subjected to the exposure process, is set to be higher than the pressure in the other air-conditioning chambers, i.e., the reticle loader chamber 18, the wafer loader chamber 20, and the exposure chamber 16 so that no gas flows into the main column 34 from the outside (i.e., it is preferable to set $P_C \geq P_{WL}, P_B, P_{RL}$).

Then, the pressure $P_{WL}$ in the wafer loader chamber 20 in which the wafer W is placed for the second longest period next to the main column 34 is set to be highest next to the pressure $P_C$ in the main column 34 (i.e., it is preferable to set to be $P_C \geq P_{WL} > P_B, P_{RL}$, more preferably to be $P_C > P_{WL} > P_B, P_{RL}$). Thereafter, the control unit 70 adjusts the flow controllers based on the detection results of each of the pressure detection unit so that each of the air-conditioning chambers mutually possesses the pressure difference indicated by the inequality (1) in accordance with the degree of cleanliness required for each of the air-conditioning chambers. That is, the control unit 70 as a pressure adjustment device sets the pressure of each chamber so that the pressure inside the air-conditioning chamber which requires the highest level of cleanliness to be the highest so that the flow of gas may be prevented from passing from an air-conditioning chamber in which a lower degree of cleanliness is allowed to the air-chamber which requires the high level of cleanliness.

Then, in the exposure apparatus 10, the pattern image of the reticle R which is supported by the reticle stage RST is exposed to the wafer W supported by the wafer stage WST, based on the detection results from each of the pressure detection units, while the pressure in each of the air-conditioning chambers is adjusted by the pressure adjusting units so as to have the pressure difference shown in the inequality (1).

As explained above, since each of the pressure detection units 34a, 20a, 16a, and 18a which detects the pressure in the corresponding air-conditioning chamber is disposed in each of the main column 34, the wafer loader chamber 20, the exposure chamber 16, and the reticle loader chamber 18 located in the main chamber 12, respectively, it becomes possible to detect the pressure inside each of the air-conditioning chambers, and accurately controls the pressure in accordance with the detection results. Also, since the pressure can be accurately controlled, the degree of cleanliness of the wafer W on which the resist is applied or that of the optical path space is maintained to be high. Accordingly, it becomes possible to prevent the deterioration of the resist applied on the wafer W or the attenuation in the intensity of the exposure light, and an exposure process can be carried out with high accuracy.

Figure 5B:
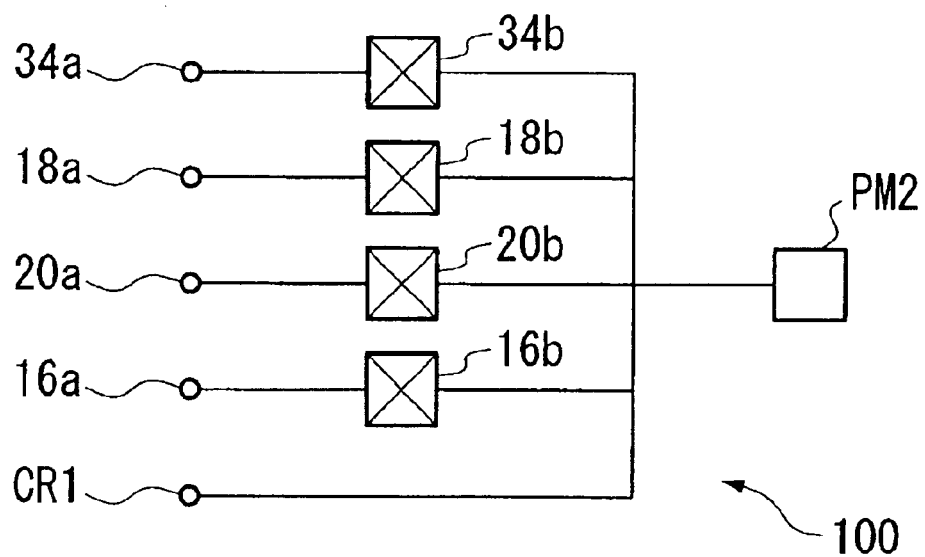

Moreover, since the pressure $P_C$ in the main column 34 in which the wafer W is placed for the longest period in the main chamber 12 is set to be higher than the pressures $P_{WL}$, $P_B$, and $P_{RL}$ in the other air-conditioning chambers, it becomes possible to prevent contaminants from flowing into the main column 34. Accordingly, it becomes possible to prevent the deterioration of the resist applied on the wafer W. Furthermore, since no contaminants flow into the main column 34 which is an optical path for the exposure light, it becomes possible to prevent the decrease in the intensity of the exposure light and the generation of uneven illuminance. As explained above, since the high cleanliness in the wafer W and the optical path can be maintained by increasing the pressure in the main column 34 to be higher than the pressure in the other air-conditioning chambers, it becomes possible to carry out an exposure process with high accuracy. Also, by setting the pressure $P_{WL}$ in the wafer loader chamber 20 in which the wafer W is placed for the second longest period next to the main column 34 to be higher, in particular, than the pressure ($P_{CD}$) in the main chamber 12, it becomes possible to prevent contaminants from flowing into the wafer loader chamber 20 (it is preferable to set to be $P_C \geq P_{WL} \geq P_{CD}$, more preferably to be $P_C > P_{WL} > P_{CD}$). Therefore, it becomes possible to prevent the deterioration of a resist when the resist is applied onto the wafer W. Note that in this embodiment, the pressure in each of the air-conditioning chambers is adjusted by, for example, the flow controller 50 to satisfy the relationship:

$$P_{RL} \geq P_{CR}$$

where $P_{CR}$ is the predetermined environment for the exposure apparatus, i.e., the pressure inside the clean room. Accordingly, it is possible for the pressure detector 100 shown in FIG. 5(a) to have the configuration shown in FIG. 5(b). In FIG. 5(b), members which are the same as those shown in FIG. 5(a) are indicated by the same reference numerals and the explanation thereof will be omitted. In FIG. 5(b), a sensor unit PM2 is a differential pressure sensor, and the difference in pressure with respect to the pressure $P_{CR}$, which is the pressure inside the clean room, as a reference is detected for each of the air-conditioning chambers. Thus, the pressure in each of the air-conditioning chambers may be accurately controlled in the same manner as described above using the detection results from the pressure detector 100. Note that although the difference in pressure of each air-conditioning chamber is detected with reference to the pressure $P_{CR}$ in the clean room, the pressure used as the reference can be another pressure, such as the pressure in one of the plurality of the air-conditioning chambers or in the coater and developer. Also, it is possible to use a pressure detector which detects the difference in pressure among the plurality of the air-conditioning chambers. At that time, it is possible to detect the difference in pressure between the air-conditioning chambers which corresponds to the difference in the adjacent terms in the inequality of (1) above, for example.

Since the pressure adjustment devices for adjusting the pressure in each of the air-conditioning chambers are provided, and the pressure adjustment devices control the pressure based on the detection results obtained from the pressure detector so that each of the plurality of the air-chambers has a predetermined pressure difference, the pressure can be accurately adjusted such that the air-conditioning chambers have a predetermined pressure difference of a degree that does not cause a large flow (air current) between the air-conditioning chambers, for example. Also, since it becomes possible, for example, not to cause a large flow in the main column 34 which is the optical path space of the exposure light, it becomes possible to prevent the generation of a large change (fluctuation) in the gas refractive index. Accordingly, an exposure process can be stably carried out and the accuracy in measurement of the optical measuring device (the laser interferometer IF, etc.) can be improved. Note that it is more effective to dispose a flow controller at an exhaust duct (return duct) connected to the air-conditioning chamber to control the pressure of the air-conditioning chambers (34, 20, etc.) in which the pressure is set to be relatively higher in the above inequality (1) as compared with the case where the flow controller is disposed at the supply duct. On the other hand, it is more effective for the air-conditioning chamber (18 etc.) in which the pressure is set to be relatively lower, to dispose a flow controller at a supply duct to adjust the pressure thereof. Also, although the flow controller is used as a pressure adjustment device in the above embodiment, the pressure adjustment device is not limited to the flow controller, and it is possible to control at least one of the pressure and the flow amount of air using a fan, for example.

The pressure adjustment device adjusts the pressure by adjusting at least one of the supply amount and the exhaust amount for each of the air-conditioning chambers. Since the pressure adjustment device is disposed at one of the supply passage and the exhaust passage connected to each of the air-conditioning chambers, and is formed by the flow controller which adjusts the flow rate of gas by adjusting the opening rate of the passage, it becomes possible to easily adjust the pressure using a simple structure.

Note that although the pressure inside the exposure apparatus (the main chamber 12) is set to be about the same or greater than the pressure outside, i.e., the pressure PCR in the predetermined environment of the exposure apparatus 10 (i.e., the pressure in the clean room) as explained above, it is preferable in this example to set the pressure inside the main chamber 12, i.e., the pressure $P_C$, $P_{WL}$, $P_B$, and $P_{RL}$ of the main column 34, the exposure chamber 16, the wafer loader chamber 20, and the reticle loader chamber 18, respectively, to be higher than the pressure $P_{CR}$ in the predetermined environment (the clean room) i.e., $P_C$, $P_{WL}$, $P_B$, $P_{RL} > P_{CR}$. More specifically, the pressure ($P_C$, $P_{WL}$, $P_B$, and $P_{RL}$) inside the main chamber 12 is set to be positive to a degree of about 0.5 Pa based on the pressure PCR of the outside (predetermined environment/clean room), i.e., each of the pressures $P_C$, $P_{WL}$, $P_B$, and $P_{RL}$ is set to be higher, by at least about 0.5 Pa, than the pressure $P_{CR}$. Also, although each of the main column 34, the wafer loader chamber 20, the exposure chamber 16, and the reticle loader chamber 18 needs to have a predetermined difference in pressure, flow (air current) is generated to cause a fluctuation as mentioned above if the difference in pressure between the air-conditioning chambers is too great, and a exposure process cannot be carried out with high accuracy or the optical measuring devices cannot perform an accurate measurement. Accordingly, by expressing the inequality (1) more specific based on the pressure PCR outside the main chamber 12 (i.e., the clean room), it is preferable to set to be:

$$1.5\,[\text{Pa}] \geq P_C' \geq P_{WL}' \geq P_B' \geq P_{RL}' \geq 0.5\,[\text{Pa}]$$

where $P_C'$, $P_{WL}'$, $P_B'$, and $P_{RL}'$ indicates the difference between the pressure $P_{CR}$ of the cl room of the main chamber 12 and each of the above-mentioned air-conditioning chambers 34, 16, 20, and 18, respectively, i.e., $$P_{CR}+1.5\,[\text{Pa}] \geq P_C \geq P_{WL} \geq P_B \geq P_{RL} \geq 0.5+P_{CR}\,[\text{Pa}] \qquad (2)$$

Also, a substrate processing device, such as a coater and developer which carries out a process for applying a resist on a wafer to be exposed and a process for developing a wafer which was subjected to the exposure process, is disposed adjacent to the wafer loader chamber 20. It is preferable to set the pressure $P_{CD}$ in the coater and developer, based on the pressure $P_{CR}$ of the outside (i.e., in the clean room), to be:

$$0\,[\text{Pa}] \leq P_{CD}' \leq 0.5\,[\text{Pa}]$$

where $P_{CD}'$ is the difference in pressure in the coater and developer with respect to the pressure $P_{CR}$ in the clean room, i.e., it is preferable to set to be:

$$P_{CR}\,[\text{Pa}] \leq P_{CD} \leq P_{CR}+0.5\,[\text{Pa}] \qquad (3)$$

Note that it is preferable in the above inequalities (2) and (3), similar to the above inequality (1), to set the pressure $P_C$ in the main column 34 to be higher than the pressures $P_{WL}$, $P_B$, $P_{RL}$ in the other air-conditioning chambers 16, 18, and 20, i.e., it is preferably set to be $P_C > P_{WL}$, $P_B$, $P_{RL}$. Also, it is preferable to set the pressure $P_{WL}$ in the wafer loader chamber 20 to be higher next to the pressure $P_C$ in the main column 34, i.e., $P_C \geq P_{WL} > P_B$, $P_{RL}$, and it is more preferable to set to be $P_C > P_{WL} > P_B$, $P_{RL}$. Moreover, it is preferable to set the pressure $P_{WL}$ to be higher than the pressure in the substrate processing device (i.e., the coater and developer, etc.), i.e., $P_C \geq P_{WL} > P_{CD}$, and it is more preferably set to be $P_C > P_{WL} > P_{CD}$.

Also, in order to prevent contaminants in the reticle loader chamber 18 from flowing into the exposure chamber 16, it is preferable to set the pressure $P_B$ in the exposure chamber 16 to be higher than the pressure $P_{RL}$ in the reticle loader chamber 18, i.e., $P_B > P_{RL}$, in both of the above inequalities (1) and (2).

Moreover, when the exposure apparatus 10 is in-line connected to a substrate processing device (the coater and developer, etc.) in the above embodiment, a buffer unit may be disposed between the two, and the buffer unit may be disposed in an air-conditioning chamber different from the chambers accommodating the two. If this configuration is adopted, it is preferable to set the pressure $P_{WL}$ in the wafer loader chamber 20 to be about the same or greater than the pressure in a buffer chamber. At that time, the air-conditioning chamber in which the buffer unit is disposed may be air-conditioned using the air-conditioning device for the exposure apparatus 10 or the substrate processing device, or it is possible to use an exclusive air-conditioning device. Also, the air-conditioning chamber in which the buffer unit is disposed may be a simple space (i.e., housing, etc.) in which the air-conditioning inside thereof is not carried out. As explained above, according to the present invention, the pressure $P_{CD}$ of the substrate processing device which is in-line connected to the exposure apparatus 10, is the pressure inside the substrate processing device when there is no buffer unit (air-conditioning chamber), and is the pressure inside the buffer unit (air-conditioning chamber) when there is a buffer unit (air-conditioning chamber). Moreover, the substrate processing device which is in-line connected to the exposure apparatus 10 is not limited to the coater and developer, and can be a foreign particle detecting device which detects foreign particles, etc. adhering to the reticle, for example. In such a case, it is preferable to set the pressure $P_{RL}$ of the reticle loader chamber 18 to be higher than the pressure $P_{CD}$ of the foreign particle detecting device which functions as the substrate processing device, i.e., it is set to be $P_{RL} \geq P_{CD}$, more preferably $P_{RL} > P_{CD}$.

Note that although it is explained above that the adjustment of the pressure in the main column 23 is carried out by adjusting the exhaust amount of gas using the flow controller 66a which is disposed at the return duct 66, it is also possible to adjust the pressure inside the main column 34 by controlling the output of the second fan 64 which functions as the supply passage for supplying the gas to the main column 34 so as to adjust the supplying amount of the gas to the main column 34. In such a case, the pressure inside the main column 34 increases by increasing the amount of gas supplied into the main column 34 by the second fan 64, and the pressure inside the main column 34 decreases by decreasing the amount of gas supplied. Also, the pressure inside the main column 34 can be adjusted by placing a flow controller having the same configuration as the flow controller 66a at the outlet 75 which functions as a supplying passage through which gas is ejected into the main column 34 so as to control the amount of gas supplied to the main column 34. In such a case, the pressure inside the main column 34 increases when the opening rate of the flow controller disposed at the outlet 75 increases since the amount of gas supplied into the main column 34 increases. Also, the pressure inside the main column 34 decreases when the opening rate decreases since the amount of gas supplied decreases. Moreover, it is possible to use both the flow controller 66a disposed at the return duct 66, which functions as an exhaust passage, and the above-mentioned flow controller disposed at the outlet 75, which functions as a supply passage, so that the pressure in the main column 34 can be adjusted by simultaneously controlling the amount of gas supplied to and exhausted from the main column 34.

In the above embodiment, although it is explained that the pressure inside the reticle loader chamber 18 is controlled by adjusting the amount of gas supplied by the flow controller 19a disposed at the halfway point (the outlet 19) of the branched passage 24a which functions as a supply passage connected to the reticle loader chamber 18, it is possible to adjust the pressure inside the reticle loader chamber 18 by disposing a flow controller at the return unit 40 connected to the return duct 42 which functions as an exhaust passage, or at the halfway point (upstream of the discharge port 42a) of the return duct 42 so that the amount of gas discharged from the reticle loader chamber 18 can be adjusted. In this case, the pressure inside the reticle loader chamber 18 decreases when the opening rate of the flow controller disposed at the return unit 40 increases since the amount of gas discharged from the reticle loader chamber 18 increases. Also, the pressure inside the reticle loader chamber increases when the opening rate decreases since the amount of discharged gas decreases. Also, it is possible to use both a flow controller disposed at the return unit 40, which functions as an exhaust passage, and the above-mentioned flow controller disposed at the outlet 19, which functions as a supply passage, or at the branched passage 24a so that the pressure of the reticle loader chamber 18 may be adjusted by simultaneously controlling the amount of gas supplied to and exhausted from the reticle loader chamber 18.

Although it is explained in the above embodiment that the pressure inside the wafer loader chamber 20 is controlled by adjusting the amount of gas supplied by the flow controller 21a disposed at the halfway point (the outlet 21) of the branched passage 24c which functions as a supply passage connected to the wafer loader chamber 20, it is possible to adjust the pressure inside the wafer loader chamber 20 by disposing a flow controller at the return unit 44 connected to the return duct 42 which functions as the exhaust passage, or at the discharge port 42a so that the amount of gas discharged from the wafer loader chamber 20 can be adjusted. In this case, the pressure inside the wafer loader chamber 20 decreases when the opening rate of the flow controller disposed at the return unit 44 increases since the amount of gas discharged from the wafer loader chamber 20 increases. Also, the pressure inside the wafer loader chamber increases when the opening rate decreases since the amount of discharged gas decreases. Also, it is possible to use both a flow controller disposed at the return unit 44, which functions as an exhaust passage, and the above-mentioned flow controller disposed at the outlet 21, which functions as a supply passage, or at the branched passage 24c so that the pressure of the wafer loader chamber 20 may be adjusted by simultaneously controlling the amount of gas supplied to and exhausted from the wafer loader chamber 20.

Although it is explained in the above embodiment that the pressure inside the exposure chamber 16 is controlled by adjusting the amount of gas supplied by the flow controller 50a disposed at the outlet 50, it is also possible to adjust the pressure inside the exposure chamber 16 by adjusting the output of the first fan 58, which functions as a passage for supplying gas, to the exposure chamber 16 via the supplying duct 24 so as to adjust the amount of gas supplied to the exposure chamber 16. In this case, the pressures inside the exposure chamber 16, the reticle loader chamber 18, and the wafer loader chamber 20 increase when the output of the first fan 58 increases to increase the amount of gas supplied into the exposure chamber 16. Also, the pressure inside the exposure chamber 16 decreases when the output of the first fan 58 decreases to decrease the amount of gas supplied. After this, the pressure inside the exposure chamber 16 can be controlled by adjusting the pressure $P_{WL}$ and $P_{RL}$ of each of the air-conditioning chambers 18 and 20 using the flow controllers 18a, and 20, respectively, or by disposing a flow controller at the outlet 90 which functions as a supply passage for ejecting a gas towards the inside of the exposure chamber 16 so as to adjust the amount of gas supplied to the exposure chamber 16. In such a case, the pressure inside the exposure chamber 16 increases when the opening rate of the flow controller disposed at the outlet 90 increases since the amount of gas supplied inside the exposure chamber 16 increases. Also, the pressure inside the exposure chamber 16 decreases when the opening rate decreases since the amount of gas supplied decreases. Also, it is possible to dispose a flow controller at the return unit 46 connected to the return duct 48 as an exhaust passage or at the halfway point of the return duct 48 so that the pressure inside the exposure chamber 16 may be controlled by adjusting the amount of gas discharged from the exposure chamber 16. In such a case, the pressure inside the exposure chamber 16 decreases when the opening rate of the flow controller disposed at the return unit 46 increases since the amount of gas discharged from the exposure chamber 16 increases. Also, the pressure inside the exposure chamber 16 increases when the opening rate decreases since the amount of discharged gas decreases. Also, it is possible to use both the flow controller disposed at the return unit 46, which functions as an exhaust passage, and the above-mentioned flow controller disposed at the OA port 50 or the outlet 90, which functions as a supply passage, so that the pressure of the exposure chamber 16 may be adjusted by simultaneously controlling the amount of gas supplied to and exhausted from the exposure chamber 16.

Although the pressures inside the main column 34, the wafer loader chamber 20, the exposure chamber 16, and the reticle loader chamber 18, respectively, are adjusted and the pressure detection device is provided with each of these air-conditioning chambers so that the pressure controlling device can adjust the pressure based on the detection results of the pressure detection device in the above embodiments, it is possible, if there is an area other than the above-mentioned air-conditioning chambers where the wafer W may be placed for a long period of time, to place the pressure detection device in that area so that the pressure can be adjusted based on the detection results of the pressure detection device. For example, for the case where a pre-alignment unit is disposed between the wafer loader chamber 20 and the main column 34 in order to roughly position the wafer W with respect to the wafer stage WST, the pressure detection device is provided with the pre-alignment unit and connected to a sensor unit (a pressure sensor, a differential pressure sensor, etc.) of the pressure detector 100 via a pressure sampling port (PSP) so that the pressure may adjusted based on the detection result from the pressure detection device. At that time, the pressure of the pre-alignment unit with respect to each of the air-conditioning chambers is set in accordance with the time period during which the wafer W is placed, i.e., in accordance with the level of required cleanliness.

Although one pressure sampling port (PSP) is provided with each of the air-conditioning chambers and the pressure is detected using one sensor unit (a pressure sensor) while switching it using an electromagnetic valve in the above embodiment, it is possible to provide a plurality of the PSPs for one air-conditioning chamber, or it is possible to directly provide one or more of pressure sensors, instead of the PSPs, with one air-conditioning chamber. For example, it is possible to dispose the pressure detection unit at, other than in the vicinity of the outlet 75, in the vicinity of the laser interferometer IF. It becomes possible to detect the fluctuation of the gas in the vicinity of the laser interferometer IF by placing the pressure detection device in the vicinity of the laser interferometer IF, and hence, it becomes possible to determine whether the laser interferometer IF is performing an accurate measurement in an environment with no fluctuation. Also, when the flow (air current) is generated in an air-conditioning chamber, it is possible to determine the condition of the flow since the velocity or the direction of the flow differs depending on the position at which the pressure detection device is placed. Moreover, it becomes possible, for example, to obtain a detection result from which the dynamic pressure component of the flow is eliminated based on the detection results from a plurality of the pressure detection devices.

Although it is explained in the above embodiment that the pressure detection device has a configuration to be incorporated in the exposure apparatus 10, and the pressure controlling device controls the pressure based on the detection results from the pressure detection device even during an exposure process, i.e., a so-called feedback control, it is possible to install a pressure detection device only when the pressure inside each air-conditioning chamber is adjusted to determine the precision of the device, such as when the exposure apparatus 10 is installed or during a periodical maintenance so that the pressure detection device may be taken out of the exposure apparatus 10 when each air-conditioning chamber is adjusted to have a predetermined difference in pressure, and the setting value of the pressure controlling device obtained during the adjustment (the opening rate of the flow controller, the output of the fan, etc.) may be maintained during the exposure process. That is, it is not necessary for the exposure apparatus 10 to have a pressure detection device, and when the apparatus 10 does not have a pressure detection device, the pressure controlling device is preset so that the inequality (1) is established and the exposure process is carried out while maintaining the set value.

Also, for the case where the pressure detection device is incorporated into the exposure apparatus 10, it is possible to adopt a configuration in which the pressure detection device stops the operation when it detects a large difference in pressure caused by, for example, opening the door of the main chamber 12 due to maintenance, etc., and a display device outputs an error signal.

Figure 7:
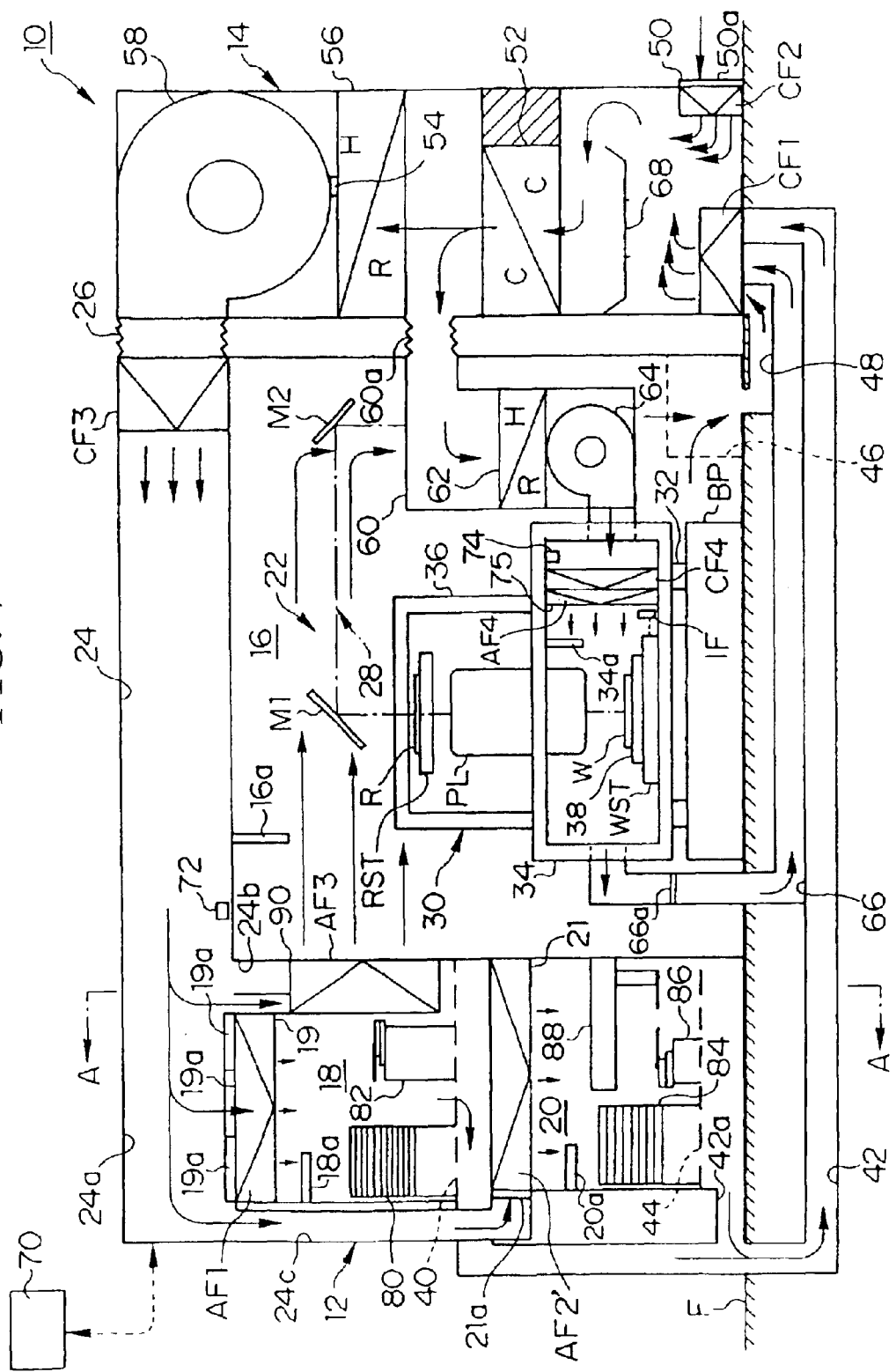
FIG. 7 is a schematic structural diagram showing another embodiment of an exposure apparatus of the present invention.

Moreover, in the above-embodiment, it is possible to place a chemical filter CF3 at one end (an end at the machinery chamber 14 side) of the above-mentioned supply passage 24 in the main chamber 12 as shown in FIG. 7. In that case, the filter box AF2 does not include a chemical filter. In addition, a chemical filter CF1 is disposed so as to oppose an opening formed at a part of the bottom surface of the machinery chamber 14 to which three return ducts 42, 48, and 66 are connected. The chemical filter CF1 can be easily placed and removed via a door provided with the machinery chamber 14, which is not shown in the figure.

As the chemical filters CF1 and CF3 used in this embodiment, similar to the chemical filters CF2 and CF4, one which is capable of removing not only basic gases, such as an ammonia gas, silicon based organic compounds, such as siloxane and silazane, and hydrocarbons present in the clean room, but also chemical contaminants, such as plasticizer and flame retardant, are employed, and specific examples thereof include an activated carbon filter or a zeolite filter.

The air-condition in the exposure apparatus having the configuration shown in FIG. 7 may be explained as follows.

The first and the second fans 58 and 64 are operated by the control unit 70 so that gas is transferred to the reticle loader chamber 18, the wafer loader chamber 20, the exposure chamber 16, and in the vicinity of the wafer stage WST in the main column 34 via the filter boxes, AF1, AF2, AF3, and AF4, respectively, to perform the air-conditioning for the above-mentioned areas. In this case, the air-conditioning is carried out by the down-flow in the reticle loader chamber 18 and the wafer loader chamber 20. Also, the above-mentioned air-conditioning of each area of the main body 22 of the exposure apparatus, which is being operated to perform the exposure process, is carried out by the side-flow. Then, the gas which is returned to the return duct 42 via the return units 40 and 44, the gas which is returned to the return duct 48 via the return unit 46, and the gas which is returned to the return duct 66 pass through the chemical filter CF1 disposed at the outlet of the return duct at the machinery chamber 14 side (the inlet of the mechanical chamber 14 in this embodiment). The above-mentioned chemical contaminants contained in the gas in each of the return ducts are adsorbed and removed when passing through the chemical filter CF1.

The gas which passed through the chemical filter CF1 is taken into the apparatus from the outside via the OA port 50, and is mixed with the chemical-clean gas which passed through the chemical filter CF2 to be cooled down to a predetermined temperature by the cooler 52 which forms the air-conditioning unit.

Then, 80% of the gas that is cooled down to the predetermined temperature by passing through the cooler 50 is transferred into the first heater 56, and the rest, 20% of the gas, is transferred into the second heater 62 to be heated to a respective target temperature. In the control unit 70, the first heater 56 is feedback controlled based on the detection value of the second temperature sensor 72, and the second heater 62 is feedback controlled based on the detection value of the third temperature sensor 74. In this case, the target temperature (including the temperature control range) of the gas ejected into the inside of the exposure chamber 16, etc., via the supply passage 24, and the target temperature (including the temperature control range) of the gas ejected in the vicinity of the wafer stage WST via the branched passage 60 can be set independently.

Then, the gases which are heated to the respective target temperature by the first and second heaters 56 and 62, respectively, to reach a degree of significant chemical cleanliness are transferred by the first and second fans 58 and 64 to the chemical filters CF3 and CF4, respectively. The gas which passed through the chemical filter CF3 is transferred into each of the reticle loader chamber 18, the wafer loader chamber 20, and the exposure chamber 16, via the supply passage 24, and the filter boxes AF1, AF2, and AF3 in the main chamber 12. Also, the gas which passed through the chemical filter CF4 is transferred in the vicinity of the wafer stage WST by passing through the filter box AF4.

In another configuration, a method for setting the pressure in each of the air-conditioning chambers, etc., is the same as for the exposure apparatus 10 shown in FIG. 1, and explanation thereof will be omitted.

Note that although the exposure chamber 18 and the main column 34 are air-conditioned using side-flow in the exposure apparatus (FIGS. 1 and 7) in the above embodiment, it is possible to carry out the air-conditioning using down-flow. Also, although the mechanical chamber 14 is disposed in the vicinity of the exposure chamber 16 in the above embodiment, it is possible to dispose at least a part of the mechanical chamber 14 in a space separated from the clean room in which the main body of the exposure apparatus in placed (for example, space below the floor of the clean room). Moreover, although the air-conditioning device (the first fan 58, etc.) is shared among the exposure chamber 16, the reticle loader chamber 18, and the wafer loader chamber 20, it is possible to provide a plurality of the air-conditioning devices so that a different air-conditioning device may be used for the exposure chamber 16, and for the reticle loader chamber 18 and the wafer loader chamber 20, for example.

Furthermore, it is possible to define each of the exposure chamber 16 in which at least a part of the main body 22 of the exposure apparatus is accommodated, the reticle loader chamber 18, and the wafer loader chamber 20 using partitioning plates, or it is possible to accommodate each of the air-conditioning chambers in a different housing (chamber). In addition, the space for each of the plurality of the air-conditioning chambers including the exposure chamber 16, etc., may be clearly defined using partitioning plates, etc., or they may be spaces which are defined without using housings or partitioning plates, and to which gases whose temperature, etc., are controlled are independently supplied. Also, the configuration of the exposure apparatus in the above embodiments (for example, the configuration of each of the air-conditioning chambers 16, 18, 20, and 34) is not limited to the one shown in FIG. 1, and can be arbitrarily determined.

Moreover, the exposure apparatus 10 of the embodiments may be applied as a scanning type exposure apparatus in which a pattern of a reticle is exposed by moving the reticle (mask) R and the wafer (substrate) W in a synchronized manner.

Furthermore, the exposure apparatus 10 of the embodiments may be applied as a step and repeat type exposure apparatus in which a pattern of a reticle is exposed in a stationary phase of the reticle and wafer, and the substrate is moved in a stepwise manner.

The application of the exposure apparatus 10 is not limited to an exposure apparatus for manufacturing semiconductor devices, and may be widely applied, for example, to an exposure apparatus for liquid crystals in which liquid crystal display element patterns are exposed on a square type glass plate, and to an exposure apparatus for manufacturing thin-film magnetic heads, pickup elements, micro-machines, DNA chips, masks (reticles) and so forth.

As a light source for the exposure apparatus 10 in the embodiments, g-line (436 nm), h-line (405 nm), i-line (365 nm) may be used.

The magnification of the projection optical system PL may not only be a reducing system but also a no magnification or an enlarging system.

When a linear motor is used for the wafer stage or the reticle stage, any one of an air-float type motor using an air-bearing and a magnetic-float type motor using Lorentz force or a reactant force may be used. Also, the stage may be a type which moves along a guide, or may be a guideless type which does not have any guide.

When a flat surface motor is used as a driving device for the stage, one of a magnetic unit (permanent magnet) and an armature unit may be connected to the stage, and the other one of the magnetic unit and the armature unit may be disposed at a moving surface side (i.e., the base) of the stage.

The reaction force generated by the movement of the wafer stage may be mechanically dissipated to the floor (ground) using a frame member as disclosed in Japanese Unexamined Patent Application, First Publication No. Hei 8-166475. The present invention may also be applied to an exposure apparatus having such a structure.

The reaction force generated by the movement of the reticle stage may be mechanically dissipated to the floor (ground) using a frame member as disclosed in Japanese Unexamined Patent Application, First Publication No. Hei 8-330224. The present invention may also be applied to an exposure apparatus having such a structure.

As described above, the exposure apparatus of the embodiments according to the present invention may be manufactured by assembling the various sub-systems having each of the structural elements within the scope of the present invention so as to maintain a predetermined mechanical precision, electrical precision, and optical precision. In order to maintain the various precisions, adjustments for maintaining optical, mechanical, and electrical precision are carried out for the various optical systems, mechanical systems, and electrical systems, respectively, before and after the assembling process. The assembly process for the exposure apparatus using each of the sub-systems includes mechanical connection, wiring connection of electrical circuits, pipe connection for air pressure circuit, and so forth. It is needless to say that each sub-system is assembled prior to the assembling process for assembling the exposure apparatus using the various sub-systems. When the process for assembling the sub-systems into the exposure apparatus is completed, a total adjustment is carried out to retain each of the precisions required for the exposure apparatus as a whole. Note that it is preferable that the manufacture of the exposure apparatus be carried out in a clean room in which the temperature, cleanliness, etc., are controlled.

Figure 6:
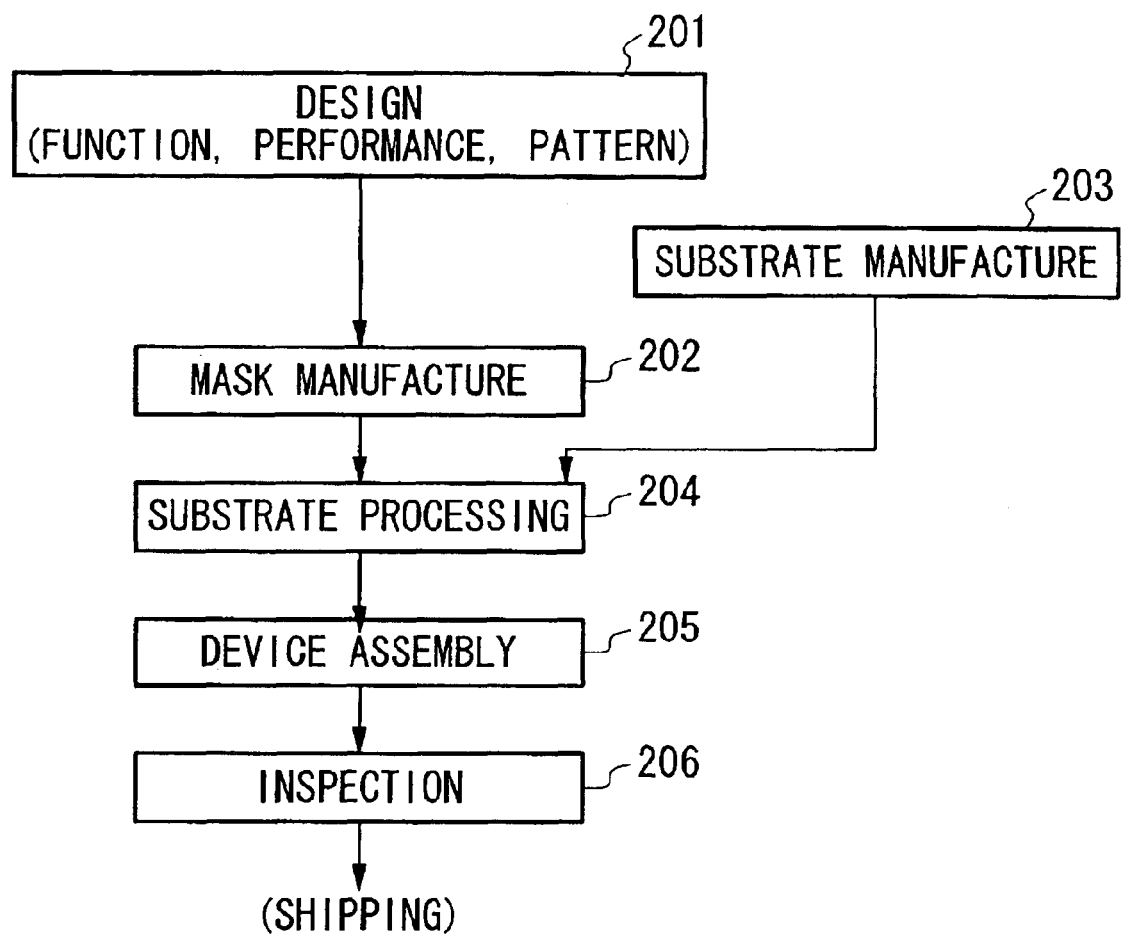
FIG. 6 is a flowchart showing an embodiment of a semiconductor device manufacturing process.

As shown in FIG. 6, a semiconductor device, may be manufactured via a step 201 in which function/performance design of the device is carried out, a step 202 in which a mask (reticle) based on the design step is manufactured, a step 203 in which a substrate (wafer, glass plate) which is a base material for the device is manufactured, a substrate processing step 204 in which the pattern of the reticle is exposed to the substrate by the exposure apparatus of the above mentioned embodiment, a device assembling step (including a dicing process, a bonding process, and a packaging process) 205, and an inspection step 206 and so forth.

INDUSTRIAL APPLICABILITY

The exposure apparatus according to the present invention has the following effects.

According to the exposure apparatus of the first embodiment of the present invention, it becomes possible to detect the pressure of each of the air-conditioning chambers by placing a pressure detection device which detects the pressure of the air-conditioning chamber, in each of the plurality of the air-conditioning chambers provided in a chamber, and to accurately control the pressure based on the detection results. Since the cleanliness of the substrate or the optical path space of the exposure light may be maintained at high level, it becomes possible to prevent the deterioration of resist when the resist is applied on the substrate and the attenuation of the exposure light in the optical path space. Accordingly, an exposure process can be carried out with high accuracy.

According to the exposure apparatus of the second embodiment of the present invention, since the pressure control device which adjust the pressure of each of the air-conditioning chambers is provided and the pressure control device adjusts the pressure based on the detection results of the pressure detection device so that each of the plurality of the air-conditioning chambers has a predetermined pressure difference, it becomes possible to control the pressure, for example, so as to generate a predetermined pressure difference in a degree not causing a large flow (air current) between the air-conditioning chambers. Accordingly, the pressure may be adjusted with high accuracy.

According to the exposure apparatus of the third and fourth embodiments of the present invention, since the pressure control device adjusts the pressure by controlling at least one of a gas supplying amount and a gas exhaust amount with respect to each of the air-conditioning chambers, and the device includes a flow controller which is provided with at least one of the supply passage and the exhaust passage and adjusts a gas flow rate by adjusting an opening rate of the passage, it becomes possible to control the pressure using a simple structure.

According to the exposure apparatus of the fifth embodiment of the present invention, since the pressure of the column chamber which accommodates the exposure stage on which the substrate is placed for the longest period in the exposure apparatus is set to be higher than the other air-conditioning chambers, contaminants present outside do not flow into the column chamber. Accordingly, it becomes possible to prevent the deterioration of the resist when the resist is applied on the substrate. Also, since the column chamber functions as the optical path space of the exposure light, it becomes possible to prevent the attenuation in the intensity of the exposure light and the generation of uneven illuminance. Accordingly, an exposure process of high accuracy can be carried out.

According to the exposure apparatus of the sixth to tenth embodiments of the present invention, since the pressure of the column chamber in which the substrate is placed for the longest period in the chamber is set to be higher than the other air-conditioning chambers, it becomes possible to prevent contaminants from flowing into the column chamber. Accordingly, it becomes possible to prevent the deterioration of the resist when the resist is applied on the substrate. Also, since contaminants do not flow into the column chamber which functions as the optical path space of the exposure light, it becomes possible to prevent the attenuation in the intensity of the exposure light. Accordingly, since the cleanliness of the substrate and the optical path space may be maintained to be high level by increasing the pressure of the column chamber to be higher than the pressure of the other air-conditioning chambers, it becomes possible to carry out an exposure process with high accuracy. Also, by setting the pressure of the substrate transfer system accommodating chamber in which the substrate is placed for the second longest period after the column chamber in the chamber to be highest among the air-conditioning chambers other than the column chamber, it becomes possible to prevent contaminants form flowing into the substrate transfer system accommodating chamber. Accordingly, it becomes possible to prevent the deterioration of the resist when the resist is applied on the substrate.

What is claimed is:

1. An exposure apparatus which exposes a substrate with a light beam from a mask in a main body, comprising:

a chamber in which the main body is provided and that has a plurality of air-conditioning chambers including a column chamber which houses a stage on which the substrate is placed, an exposure chamber which houses the main body, a mask transfer system housing chamber which houses a mask transfer system to transfer the mask, and a substrate transfer system housing chamber which houses a substrate transfer system to transfer the substrate, wherein a relational expression $P_C \geq P_{WL} \geq P_B \geq P_{RL}$ is satisfied, where $P_C$ is a pressure of the column chamber, $P_B$ is a pressure of the exposure chamber, $P_{RL}$ is a pressure of the mask transfer system housing chamber, and $P_{WL}$ is a pressure of the substrate transfer system housing chamber; and a pressure detection device which detects pressure information with respect to the plurality of air-conditioning chambers.

2. An exposure apparatus according to claim 1, further comprising:
a pressure controlling device which adjusts pressure in each of said air-conditioning chambers, wherein
said pressure controlling device adjusts the pressure based on the pressure information detected so that the relational expression is satisfied.

3. An exposure apparatus according to claim 2, wherein:
said pressure controlling device performs said adjustment by controlling at least one of a gas supplying amount and a gas exhaust amount with respect to each of said air-conditioning chambers.

4. An exposure apparatus according to claim 3, further comprising:
a supply passage and an exhaust passage connected to each of said air-conditioning chambers, wherein
said pressure controlling device includes a passage opening rate adjusting unit which is provided with at least one of the supply passage and the exhaust passage, and adjusts a gas flow rate by adjusting an opening rate of the passage.

5. An exposure apparatus according to claim 1, wherein the pressure of said column chamber is higher than the pressure of the substrate transfer system housing chamber.

6. An exposure apparatus according to claim 1, wherein $P_{WL} \geq P_{CD}$ is satisfied where $P_{CD}$ is a pressure of a substrate processing device which is connected to the exposure apparatus.

7. An exposure apparatus according to claim 1, wherein $P_{RL} \geq P_{CR}$ is satisfied where $P_{CR}$ is a pressure of a predetermined environment of the exposure apparatus.

8. A device manufacturing method, comprising the step of transferring a pattern onto a photosensitive object using an exposure apparatus according to claim 1.

9. An exposure apparatus which exposes a substrate with a light beam from a mask in a main body, comprising:
a chamber in which the main body is provided and that has a plurality of air-conditioning chambers including a column chamber which accommodates a stage on which the substrate is placed, an exposure chamber which accommodates the main body, a mask transfer system accommodating chamber which accommodates a mask transfer system to transfer the mask, and a substrate transfer system accommodating chamber which accommodates a substrate transfer system to transfer the substrate; and
a pressure controlling device which adjusts pressure in at least one of the air-conditioning chambers so as to satisfy:

$$P_C \geq P_{WL} \geq P_B \geq P_{RL}$$

where $P_C$ is a pressure of said column chamber, $P_B$ is a pressure of said exposure chamber, $P_{RL}$ is a pressure of said mask transfer system accommodating chamber, and $P_{WL}$ is a pressure of said substrate transfer system accommodating chamber.

10. An exposure apparatus according to claim 9, wherein $P_{RL} \geq P_{CR}$ is satisfied where $P_{CR}$ is a pressure of a predetermined environment of the exposure apparatus.

11. An exposure apparatus according to claim 10, wherein $P_{WL} \geq P_{CD}$ is satisfied where $P_{CD}$ is a pressure of a substrate processing device which is in-line connected to the exposure apparatus.

12. An exposure apparatus which transfers a pattern of a first object onto a second object, comprising:
a first chamber in which at least said first object of a main body of the exposure apparatus which exposes said second object using an illumination beam via said first object is disposed;
a second chamber in which at least said second object of said main body of the exposure apparatus is disposed;
a third chamber in which a first transfer system is disposed which transfers said first object to/from said first chamber;
a fourth chamber in which a second transfer system is disposed which transfers said second object to/from said second chamber; and
a gas supply device which supplies a gas to each of said first chamber, second chamber, third chamber, and fourth chamber, at least a temperature of said gas being controlled; wherein
pressure of each of said chambers is set so as to satisfy:

$$P_C \geq P_{WL} \geq P_B \geq P_{RL}$$

where $P_B$ is a pressure of said first chamber, $P_C$ is a pressure of said second chamber, $P_{RL}$ is a pressure of said third chamber, and $P_{WL}$ is a pressure of said fourth chamber.

13. An exposure apparatus according to claim 12, wherein the pressure of each of said chambers is set to be about the same or higher than a pressure $P_{CR}$ of a predetermined environment of the exposure apparatus.

14. An exposure apparatus according to claim 13, wherein the pressure of each of said chambers is set to be higher than the pressure $P_{CR}$ of the predetermined environment, and the pressure $P_{RL}$ of said third chamber is set so that a difference in pressure with respect to the predetermined environment becomes about 0.5 [Pa] or greater.

15. An exposure apparatus according to claim 14, wherein the pressure $P_C$ of said second chamber is set so that a difference in pressure with respect to the predetermined environment becomes about 1.5 [Pa] or smaller.

16. An exposure apparatus according to claim 12, wherein the pressure $P_{WL}$ of said fourth chamber is set to be about the same or higher than a pressure $P_{CD}$ of a substrate processing device which is in-line connected to the exposure apparatus.

17. An exposure apparatus according to claim 16, wherein the pressure $P_{WL}$ of said fourth chamber is set to be higher than the pressure $P_{CD}$ of said substrate processing device and lower than the pressure $P_C$ of said second chamber.

18. An exposure apparatus according to claim 17, wherein the pressure $P_{WL}$ of said fourth chamber is set to be higher than the pressures $P_B$ and $P_{RL}$ of said first and third chambers, respectively.

19. An exposure apparatus according to claim 16, further comprising:
a pressure detection device which detects pressure information relating to at least one of said first, second, third, and fourth chambers.

20. An exposure apparatus according to claim 12, wherein the pressure $P_{WL}$ of said fourth chamber is set to be higher than the pressures $P_B$ and $P_{RL}$ of said first and third chambers, respectively.

21. An exposure apparatus according to claim 20, wherein the pressure $P_C$ of said second chamber is set to be higher than the pressure $P_{WL}$ of said fourth chamber.

22. An exposure apparatus according to claim 20, further comprising:
a pressure detection device which detects pressure information relating to at least one of said first, second, third, and fourth chambers.

* * * * *